United States Patent
Shoki et al.

(10) Patent No.: US 11,048,159 B2
(45) Date of Patent: Jun. 29, 2021

(54) METHOD FOR MANUFACTURING REFLECTIVE MASK BLANK, REFLECTIVE MASK BLANK, METHOD FOR MANUFACTURING REFLECTIVE MASK, REFLECTIVE MASK, AND METHOD FOR MANUFACTURING SEMICONDUCTOR DEVICE

(71) Applicant: HOYA CORPORATION, Tokyo (JP)

(72) Inventors: Tsutomu Shoki, Tokyo (JP); Takahiro Onoue, Tokyo (JP)

(73) Assignee: HOYA CORPORATION, Tokyo (JP)

( * ) Notice: Subject to any disclaimer, the term of this patent is extended or adjusted under 35 U.S.C. 154(b) by 181 days.

(21) Appl. No.: 16/084,332

(22) PCT Filed: Mar. 21, 2017

(86) PCT No.: PCT/JP2017/011180
§ 371 (c)(1),
(2) Date: Sep. 12, 2018

(87) PCT Pub. No.: WO2017/169973
PCT Pub. Date: Oct. 5, 2017

(65) Prior Publication Data
US 2019/0079382 A1 Mar. 14, 2019

(30) Foreign Application Priority Data

Mar. 31, 2016 (JP) .............................. JP2016-072287
Sep. 29, 2016 (JP) .............................. JP2016-190721

(51) Int. Cl.
| | |
|---|---|
| *G03F 1/24* | (2012.01) |
| *G03F 1/42* | (2012.01) |
| *G03F 1/84* | (2012.01) |
| *G03F 1/26* | (2012.01) |
| *G03F 1/44* | (2012.01) |
| *G03F 7/20* | (2006.01) |

(52) U.S. Cl.
CPC .................. *G03F 1/24* (2013.01); *G03F 1/26* (2013.01); *G03F 1/42* (2013.01); *G03F 1/44* (2013.01); *G03F 1/84* (2013.01); *G03F 7/2008* (2013.01)

(58) Field of Classification Search
CPC ........................................................ G03F 1/24
See application file for complete search history.

(56) References Cited

U.S. PATENT DOCUMENTS

2014/0302429 A1* 10/2014 Shoki ........................ G03F 1/24
430/5
2016/0004153 A1 1/2016 Shoki et al.
2017/0131629 A1* 5/2017 Hamamoto ............... G03F 1/24

FOREIGN PATENT DOCUMENTS

| JP | 2014-170948 A | 6/2004 |
|---|---|---|
| JP | 2013-131728 A | 7/2013 |
| JP | 2013-219339 A | 10/2013 |
| JP | 2013-222811 A | 10/2013 |
| JP | 2014099462 A | 5/2014 |
| JP | 2015-090421 A | 5/2015 |
| WO | 2008/129914 A1 | 10/2008 |
| WO | 2014/129527 A1 | 8/2014 |
| WO | 2015/146140 A1 | 10/2015 |

OTHER PUBLICATIONS

International Search Report for PCT/JP2017/011180 dated, Jun. 20, 2017.
KR 10-2018-7026596, "Notification of Reasons for Refusal" with Machine Translation, dated Feb. 25, 2021, 33 pages.

* cited by examiner

*Primary Examiner* — Kathleen Duda
(74) *Attorney, Agent, or Firm* — Kilpatrick Townsend & Stockton LLP

(57) ABSTRACT

A method of manufacturing a reflective mask blank includes: forming a multilayer reflective film, which is configured to reflect EUV light, on a substrate to form a substrate with a multilayer reflective film; subjecting the substrate with a multilayer reflective film to defect inspection; forming an absorber film, which is configured to absorb the EUV light, on the multilayer reflective film of the substrate with a multilayer reflective film; forming a reflective mask blank, in which an alignment region is formed in an outer peripheral edge region of a pattern formation region by removing the absorber film so that the multilayer reflective film of an area including an element serving as a reference of defect information on the multilayer reflective film is exposed in the alignment region; and performing defect management of the reflective mask blank through use of the alignment region.

24 Claims, 7 Drawing Sheets

METHOD FOR MANUFACTURING REFLECTIVE MASK BLANK, REFLECTIVE MASK BLANK, METHOD FOR MANUFACTURING REFLECTIVE MASK, REFLECTIVE MASK, AND METHOD FOR MANUFACTURING SEMICONDUCTOR DEVICE

CROSS REFERENCE TO RELATED APPLICATIONS

This application is a National Stage of International Application No. PCT/JP2017/011180 filed Mar. 21, 2017, claiming priority based on Japanese Patent Application No. 2016-072287, filed Mar. 31, 2016 and Japanese Patent Application No. 2016-190721 filed Sep. 29, 2016, the disclosure of which is incorporated herein in its entirety by reference.

TECHNICAL FIELD

This invention relates to a method of manufacturing a reflective mask blank to be used for manufacturing a semiconductor device, a reflective mask blank, a method of manufacturing a reflective mask, and a reflective mask.

BACKGROUND ART

In general, in a manufacturing process for a semiconductor device, a fine pattern is formed through use of photolithography. Further, a number of transfer masks called photomasks are usually used for forming the fine pattern. The transfer mask generally has a fine pattern formed of a metal thin film or the like on a transparent glass substrate, and photolithography is also used for manufacturing the transfer mask.

In manufacturing of a transfer mask by photolithography, a mask blank including a thin film (for example, a light shielding film) for forming a transfer pattern (mask pattern) on a transparent substrate, for example, a glass substrate, is used. The manufacturing of a transfer mask through use of the mask blank is performed through a drawing step of drawing a desired pattern on a resist film formed on the mask blank, a developing step of, after drawing, developing the resist film to form a desired resist pattern, an etching step of etching the thin film using the resist pattern as a mask, and a step of peeling and removing the remaining resist pattern. In the developing step, a developer is supplied to the resist film formed on the mask blank after the desired pattern is drawn on the resist film, and a site of the resist film that is soluble in the developer is dissolved, to thereby form a resist pattern. Further, in the etching step, a site in which the resist pattern is not formed and the thin film is exposed is removed by dry etching or wet etching using the resist pattern as a mask. As a result, a desired mask pattern is formed on the transparent substrate. Thus, a transfer mask is completed.

As the kind of the transfer mask, a phase shift mask has been known besides a related-art binary mask having a light shielding film pattern formed of a chromium-based material on a transparent substrate.

Further, in recent years, in the semiconductor industry, along with an increase in integration of a semiconductor device, there has been required a fine pattern exceeding a transfer limit of related-art photolithography using ultraviolet light. In order to enable formation of such fine pattern, EUV lithography, which is an exposure technology using extreme ultraviolet (hereinafter referred to as "EUV") light, has been regarded as being promising. In this case, the EUV light refers to light having a wavelength band in a soft X-line region or a vacuum ultraviolet region, and specifically, to light having a wavelength of from about 0.2 nm to about 100 nm. As a mask to be used in this EUV lithography, a reflective mask has been proposed. The reflective mask has a configuration in which a multilayer reflective film, which is configured to reflect EUV light that is exposure light, is formed on a substrate, and an absorber film, which is configured to absorb the EUV light, is patterned on the multilayer reflective film.

As described above, as the demand for miniaturization in a lithography step increases, problems in the lithography step are becoming conspicuous. One of the problems is a problem regarding defect information on a substrate for a mask blank and the like to be used in the lithography step.

In the related art, in blank inspection and the like, the position at which a defect of a substrate has occurred has been identified based on a distance from an origin (0, 0) being a substrate center through use of coordinates managed by a defect inspection device. Therefore, the standard of absolute value coordinates is not clear, and the position accuracy is low. Further, there is a variation in detection between devices, and even when a thin film for forming a pattern is patterned while a defect is avoided at a time of pattern drawing, it has been difficult to avoid the defect on the order of μm. Therefore, the defect has been avoided by changing the direction of transferring a pattern or displacing a transfer position roughly on the order of mm.

Under the above-mentioned circumstances, in order to enhance the accuracy of inspection of a defect position, for example, it has been proposed to form fiducial marks on a substrate for a mask blank and identify the position of a defect with the fiducial marks being reference positions.

In Patent Document 1, there is disclosed a method involving forming at least three marks each having a size of from 30 nm to 100 nm in sphere equivalent diameter on a film forming surface of a substrate for a reflective mask blank for EUV lithography so that the position of a minute defect having a sphere equivalent diameter of about 30 nm can be accurately identified.

PRIOR ART DOCUMENT(S)

Patent Document(s)

Patent Document 1: WO2008/129914A1

SUMMARY OF THE INVENTION

Problem to be Solved by the Invention

It is possible to enhance the accuracy of inspection of a defect position of a mask blank by the method using fiducial marks for identifying the position of a defect as disclosed in Patent Document 1 described above.

In a reflective mask using EUV light as exposure light, in particular, a defect that is present on a multilayer reflective film can hardly be corrected and may serve as a serious phase defect on a transfer pattern, and hence defect information on the multilayer reflective film is important in order to reduce a transfer pattern defect. Therefore, it is desired that defect inspection be performed at least after formation of the multilayer reflective film to acquire defect information. For this purpose, it is considered to be preferred that fiducial marks be formed, for example, on a multilayer reflective film of a substrate with the multilayer reflective film, which is manufactured by forming the multilayer reflective film on a substrate.

However, when the fiducial marks are formed on the multilayer reflective film, in an electron beam drawing step in manufacturing of a mask after defect inspection on the multilayer reflective film with reference to the fiducial marks formed on the multilayer reflective film, alignment is performed with the fiducial marks after an absorber film is formed. Therefore, there is a risk in that a change in mark shape caused by formation of the absorber film on the fiducial marks having a recessed shape may serve as an alignment error. Further, when defect information on a reflective mask blank is acquired by performing defect inspection of the reflective mask blank in addition to the defect information on the substrate with a multilayer reflective film, in the case where alignment is performed with the fiducial marks after formation of the above-mentioned absorber film, there is a risk in that an alignment error may occur, and thus the accuracy of defect position information (defect coordinates) on the reflective mask blank may be degraded even when defect inspection with high accuracy is performed with reference to the fiducial marks.

Meanwhile, along with rapid miniaturization of a pattern in lithography using EUV light, a defect size required in an EUV mask, which is a reflective mask, is becoming minute year after year, and in order to find such minute defect, an inspection light source wavelength to be used in defect inspection is approaching a light source wavelength of exposure light (for example, EUV light).

As a defect inspection device for an EUV mask, an EUV mask blank, which is a master of the EUV mask, a substrate with a multilayer reflective film, and a substrate, for example, a mask substrate/blank defect inspection system for EUV exposure [MAGICS M7360] having an inspection light source wavelength of 266 nm manufactured by Lasertec Corporation, EUV mask/blank defect inspection system "Teron 600 series, for example, Teron 610" having an inspection light source wavelength of 193 nm manufactured by KLA-Tencor Corporation, and the like have been widely used. In recent years, there has been proposed an actinic blank inspection (ABI) device having an exposure light source wavelength of 13.5 nm as an inspection light source wavelength.

However, in order to solve the above-mentioned problem, which occurs when the fiducial marks are formed on the multilayer reflective film, it is conceivable to form fiducial marks in an upper portion of the absorber film after formation of the absorber film and perform defect inspection of the reflective mask blank with reference to the fiducial marks. However, for example, when an attempt is made to perform defect inspection of the reflective mask blank through use of the above-mentioned ABI device, the reflectance of the absorber film with respect to a wavelength of 13.5 nm is low, and hence there arises another problem in that a defect cannot be detected with high sensitivity.

This invention has been made to solve the above-mentioned problems in the related art, and a first object of this invention is to provide a reflective mask blank and a method of manufacturing the reflective mask blank, with which defect information with satisfactory accuracy including defect position information in a multilayer reflective film is acquired, and defect management of the reflective mask blank can be performed with high accuracy.

A second object of this invention is to provide a reflective mask for which the reflective mask blank is used, and a defect is reduced.

Means to Solve the Problem

In order to solve the above-mentioned problems, the inventors of this invention have found that the above-mentioned problems can be solved by forming a multilayer reflective film on a substrate, subjecting the multilayer reflective film to defect inspection, then forming an absorber film on the multilayer reflective film, forming a reflective mask blank in which an alignment region is formed by removing a part of the absorber film in an outer peripheral edge region of a pattern formation region so that the multilayer reflective film of an area including, for example, a first fiducial mark serving as a reference of defect information on the multilayer reflective film is exposed in the alignment region, and then performing defect management of the reflective mask blank through use of the alignment region.

The inventors of this invention have continuously conducted extensive researches based on the above-mentioned clarified fact, and as a result, have achieved the inventions according to Configurations 1 to 13 described below.

(Configuration 1)

A method of manufacturing a reflective mask blank including at least a multilayer reflective film, which is configured to reflect EUV light and is formed on a substrate, and an absorber film, which is configured to absorb the EUV light and is formed on the multilayer reflective film, the method comprising the steps of: forming the multilayer reflective film on the substrate to form a substrate with a multilayer reflective film; subjecting the substrate with a multilayer reflective film to defect inspection; forming the absorber film on the multilayer reflective film of the substrate with a multilayer reflective film; forming a reflective mask blank, in which an alignment region is formed in an outer peripheral edge region of a pattern formation region by removing the absorber film so that the multilayer reflective film of an area including an element serving as a reference of defect information on the multilayer reflective film is exposed in the alignment region; and performing defect management of the reflective mask blank through use of the alignment region.

(Configuration 2)

A method of manufacturing a reflective mask blank according to configuration 1, wherein the defect management of the reflective mask blank is performed through use of a first fiducial mark formed in the alignment region.

(Configuration 3)

A method of manufacturing a reflective mask blank according to configuration 2, further comprising a step of forming a second fiducial mark, which serves as a reference of the first fiducial mark, in the absorber film, wherein the defect management of the reflective mask blank includes detecting coordinates of the first fiducial mark with reference to the second fiducial mark, and converting the defect information on the substrate with a multilayer reflective film with reference to the second fiducial mark.

(Configuration 4)

A method of manufacturing a reflective mask blank according to configuration 3, wherein the detecting of the coordinates of the first fiducial mark with reference to the second fiducial mark is performed through use of inspection light having a wavelength of less than 100 nm.

(Configuration 5)

A method of manufacturing a reflective mask blank according to any one of configurations 1 to 4, wherein the defect inspection of the substrate with a multilayer reflective film is performed through use of inspection light having a wavelength of less than 100 nm.

(Configuration 6)

A reflective mask blank, comprising at least a multilayer reflective film, which is configured to reflect EUV light and is formed on a substrate, and an absorber film, which is configured to absorb the EUV light and is formed on the multilayer reflective film, wherein the reflective mask blank has an alignment region formed in an outer peripheral edge region of a pattern formation region so that the multilayer reflective film of an area including an element serving as a reference of defect information on the multilayer reflective film is exposed in the alignment region.

(Configuration 7)

A reflective mask blank according to configuration 6, wherein the reflective mask blank has a first fiducial mark formed in the alignment region as the element serving as the reference of the defect information on the multilayer reflective film.

(Configuration 8)

A reflective mask blank according to configuration 7, wherein the reflective mask blank has a second fiducial mark, which serves as a reference of the first fiducial mark, formed in a vicinity of the alignment region in the absorber film.

(Configuration 9)

A method of manufacturing a reflective mask, the method comprising patterning the absorber film in the reflective mask blank obtained by the method of manufacturing a reflective mask blank of any one of configurations 1 to 5 or in the reflective mask blank of any one of configurations 6 to 8, to form an absorber film pattern.

(Configuration 10)

A reflective mask, comprising at least a multilayer reflective film, which is configured to reflect EUV light and is formed on a substrate, and an absorber film pattern, which is configured to absorb the EUV light and is formed on the multilayer reflective film, wherein the reflective mask has an alignment region formed in an outer peripheral edge region of a pattern formation region so that the multilayer reflective film of an area including an element serving as a reference of defect information on the multilayer reflective film is exposed in the alignment region.

(Configuration 11)

A reflective mask according to configuration 10, wherein the reflective mask has a first fiducial mark formed in the alignment region as the element serving as the reference of the defect information on the multilayer reflective film.

(Configuration 12)

A reflective mask according to configuration 11, wherein the reflective mask has a second fiducial mark, which serves as a reference of the first fiducial mark, formed in a vicinity of the alignment region in the absorber film pattern.

(Configuration 13)

A method of manufacturing a semiconductor device, comprising transferring a transfer pattern by exposure to a resist film on a semiconductor substrate through use of the reflective mask of any one of configurations 10 to 12, to manufacture a semiconductor device.

In order to solve the above-mentioned problems, the inventors of this invention have further found that the above-mentioned problems can be solved by forming a multilayer reflective film on a substrate, subjecting the multilayer reflective film to defect inspection, then forming an absorber film on the multilayer reflective film without forming the absorber film in an outer peripheral edge region of a pattern formation region, to thereby form a reflective mask blank, in which an alignment region is formed so that the multilayer reflective film of an area including a first fiducial mark serving as a reference of defect information on the multilayer reflective film is exposed in the alignment region, and in which a second fiducial mark serving as a reference of the first fiducial mark is formed in the vicinity of the pattern formation region side of the alignment region in the absorber film, and then performing defect management of the reflective mask blank through use of the alignment region.

The inventors of this invention have achieved the inventions according to Configurations 14 to 23 described below based on the above-mentioned clarified fact.

(Configuration 14)

A method of manufacturing a reflective mask blank including at least a multilayer reflective film, which is configured to reflect EUV light and is formed on a substrate, and an absorber film, which is configured to absorb the EUV light and is formed on the multilayer reflective film, the method comprising the steps of: forming the multilayer reflective film on the substrate to form a substrate with a multilayer reflective film; subjecting the substrate with a multilayer reflective film to defect inspection; and forming the absorber film on the multilayer reflective film of the substrate with a multilayer reflective film to form a reflective mask blank, the forming the absorber film including a step of forming, in an outer peripheral edge region of a pattern formation region, an alignment region without forming the absorber film so that the multilayer reflective film of an area including a first fiducial mark, which serves as a reference of defect information on the multilayer reflective film, is exposed in the alignment region, the method further comprising the steps of: forming a second fiducial mark, which serves as a reference of the first fiducial mark, in a vicinity of the pattern formation region side of the alignment region in the absorber film; and performing defect management of the reflective mask blank through use of the alignment region.

(Configuration 15)

A method of manufacturing a reflective mask blank according to configuration 14, wherein the step of forming the alignment region includes forming the absorber film with a shielding member being provided so that the absorber film is prevented from being formed and the multilayer reflective film is exposed.

(Configuration 16)

A method of manufacturing a reflective mask blank according to configuration 14 or 15, wherein the defect management of the reflective mask blank is performed through use of the first fiducial mark formed in the alignment region.

(Configuration 17)

A method of manufacturing a reflective mask blank according to any one of configurations 14 to 16, wherein the defect management of the reflective mask blank includes detecting coordinates of the first fiducial mark with reference to the second fiducial mark, and converting the defect information on the substrate with a multilayer reflective film with reference to the second fiducial mark.

(Configuration 18)

A method of manufacturing a reflective mask blank according to configuration 17, wherein the detecting of the coordinates of the first fiducial mark with reference to the second fiducial mark is performed through use of inspection light having a wavelength of less than 100 nm.

(Configuration 19)

A method of manufacturing a reflective mask blank according to any one of configurations 14 to 18, wherein the defect inspection of the substrate with a multilayer reflective film is performed through use of inspection light having a wavelength of less than 100 nm.

(Configuration 20)

A reflective mask blank, comprising at least a multilayer reflective film, which is configured to reflect EUV light and is formed on a substrate, and an absorber film, which is configured to absorb the EUV light and is formed on the multilayer reflective film, wherein the reflective mask blank has an alignment region formed in an outer peripheral edge region of a pattern formation region so that the multilayer reflective film of an area including a first fiducial mark, which serves as a reference of defect information on the multilayer reflective film, is exposed in the alignment region, and wherein the reflective mask blank has a second fiducial mark, which serves as a reference of the first fiducial mark, formed in a vicinity of the pattern formation region side of the alignment region in the absorber film.

(Configuration 21)

A method of manufacturing a reflective mask, comprising patterning the absorber film in the reflective mask blank obtained by the method of manufacturing a reflective mask blank of any one of configurations 14 to 19 or in the reflective mask blank of configuration 20, to form an absorber film pattern.

(Configuration 22)

A reflective mask, comprising at least a multilayer reflective film, which is configured to reflect EUV light and is formed on a substrate, and an absorber film pattern, which is configured to absorb the EUV light and is formed on the multilayer reflective film, wherein the reflective mask has an alignment region formed in an outer peripheral edge region of a pattern formation region so that the multilayer reflective film of an area including a first fiducial mark, which serves as a reference of defect information on the multilayer reflective film, is exposed in the alignment region, and wherein the reflective mask has a second fiducial mark, which serves as a reference of the first fiducial mark, formed in a vicinity of the pattern formation region side of the alignment region in the absorber film pattern.

(Configuration 23)

A method of manufacturing a semiconductor device, comprising transferring a transfer pattern by exposure to a resist film on a semiconductor substrate through use of the reflective mask of configuration 22, to manufacture a semiconductor device.

Effect of the Invention

According to this invention, it is possible to provide the reflective mask blank and the method of manufacturing the reflective mask blank with which defect information with satisfactory accuracy including defect position information in a multilayer reflective film is acquired, and defect management of the reflective mask blank can be performed with high accuracy.

Further, according to this invention, it is possible to provide the reflective mask in which the above-mentioned reflective mask blank is used, and drawing data is modified based on the above-mentioned defect information, to thereby reduce defects.

BRIEF DESCRIPTION OF THE DRAWING

FIG. 5 is a view for illustrating a relationship between the second fiducial mark and scanning directions of defect inspection light or the like.

MODES FOR EMBODYING THE INVENTION

Now, embodiments of this invention are described in detail.

Reflective Mask Blank According to First Embodiment

Figure 1:
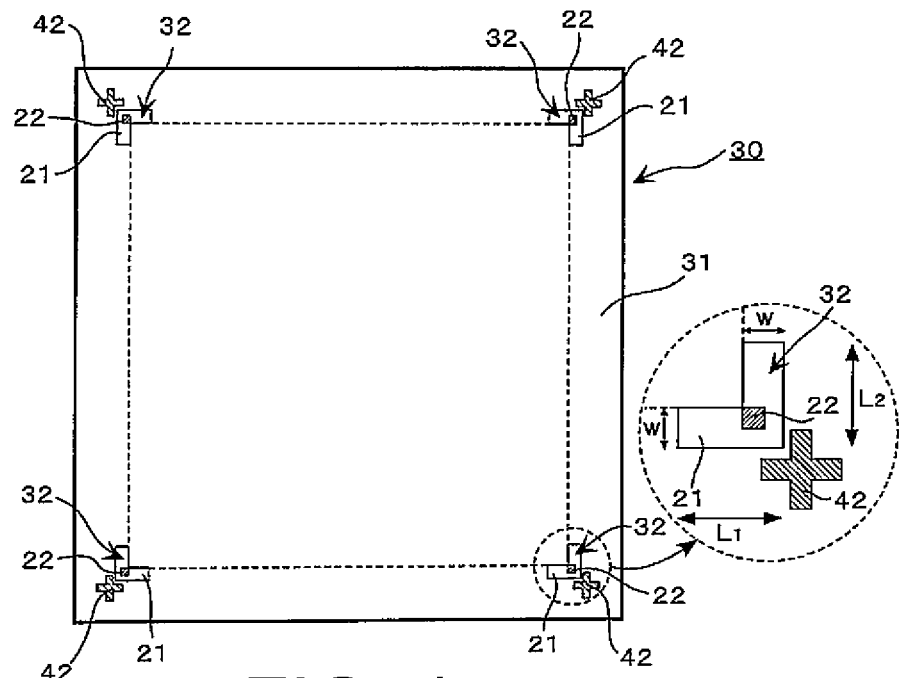
FIG. 1 is a plan view for illustrating a reflective mask blank according to a first embodiment of this invention.
Figure 2:
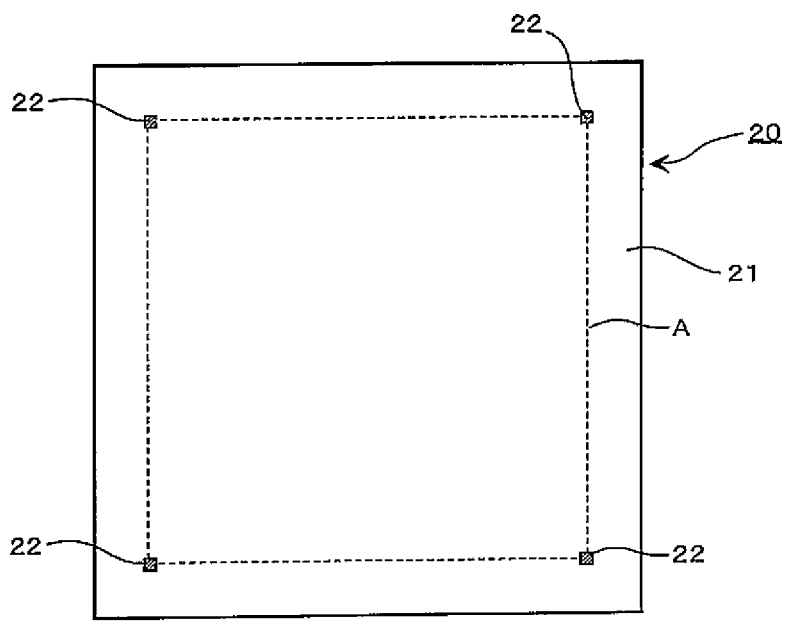
FIG. 2 is a plan view of a substrate with a multilayer reflective film forming the reflective mask blank illustrated in FIG. 1.

FIG. 1 is a plan view for illustrating a reflective mask blank according to a first embodiment of this invention. Further, FIG. 2 is a plan view of a substrate with a multilayer reflective film forming the reflective mask blank illustrated in FIG. 1. Further, FIG. 6 includes schematic sectional views for illustrating manufacturing steps for a reflective mask blank and a reflective mask in the first embodiment of this invention.

Figure 6:
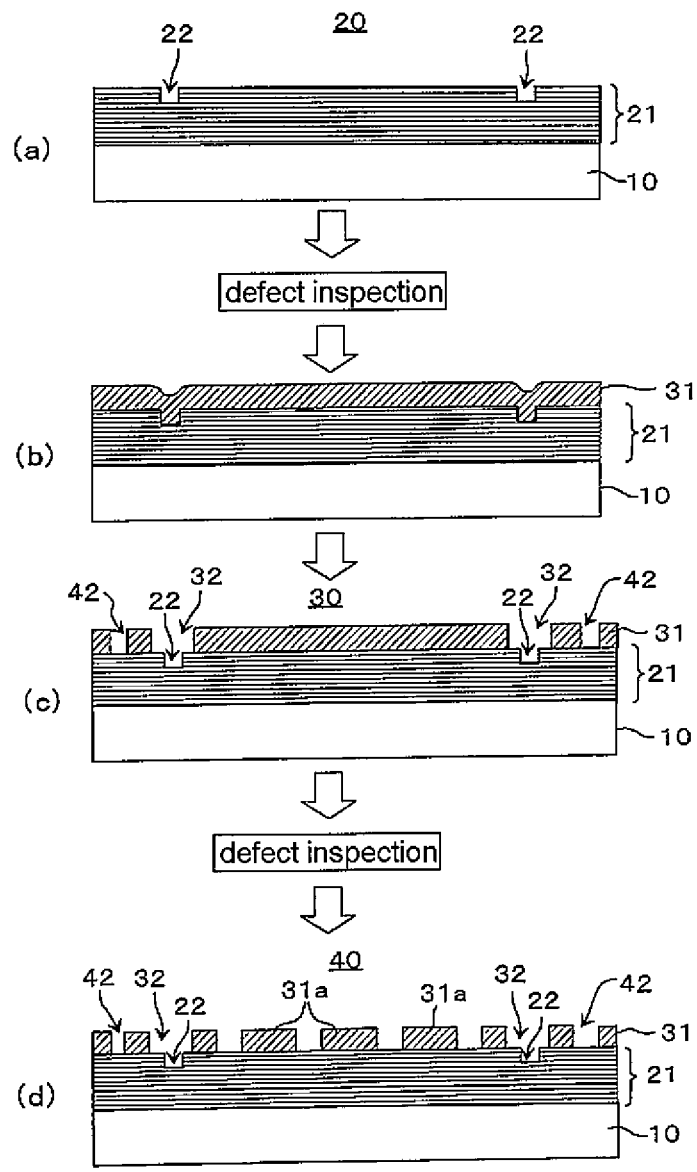
FIG. 6 includes schematic sectional views for illustrating manufacturing steps for a reflective mask blank and a reflective mask in the first embodiment of this invention.

As illustrated in FIGS. 1 and 6, a reflective mask blank 30 according to the first embodiment of this invention includes at least a multilayer reflective film 21, which is configured to reflect EUV light that is exposure light and is formed on a substrate 10, and an absorber film 31, which is configured to absorb the EUV light and is formed on the multilayer reflective film 21 (see FIG. 6(c)). In an outer peripheral edge region of a pattern formation region (region surrounded by the broken line in FIG. 1) on a main surface of the reflective mask blank 30, a plurality of alignment regions 32 are formed. The pattern formation region is a region in which a transfer pattern is formed in the absorber film 31. In a substrate having a dimension of six inches on each side, the pattern formation region corresponds to, for example, a region of 132 mm×132 mm. The alignment region 32 is a region (cutout region) in which the multilayer reflective film 21 of an area including an element serving as a reference of defect information on the multilayer reflective film 21 is exposed. In the first embodiment, as one example of the above-mentioned element serving as a reference of the defect information, a first fiducial mark 22 is formed on the multilayer reflective film 21. Further, a second fiducial mark 42 for performing alignment in an electron beam drawing step in manufacturing of a mask, which serves as a reference of the first fiducial mark 22, is formed in the vicinity of the alignment region 32 in the absorber film 31. It is only required that the second fiducial mark 42 and the first fiducial mark in the alignment region 32 have, for example, a positional relationship in which the second fiducial mark 42 and the first fiducial mark fall within a region of 10 mm×10 mm.

Further, it is desired that the second fiducial mark 42 be formed so as to be relatively larger than the first fiducial mark 22. That is, it is preferred that the width or the length of the second fiducial mark 42 be larger than that of the first fiducial mark 22, and/or the depth or the height of a sectional shape of the second fiducial mark 42 be larger than that of the first fiducial mark 22.

Further, in the first embodiment, the alignment region 32 and the second fiducial mark 42 are formed, as one example, in the outer peripheral edge region of the pattern formation region of the reflective mask blank 30, specifically, in four portions in the vicinity of corners of the pattern formation region. However, this invention is not limited thereto. In the first embodiment, the alignment region 32 is a region in which the multilayer reflective film 21 of the area including the first fiducial mark 22 formed on the multilayer reflective film 21 is exposed. Therefore, the positions and number of the formed alignment regions 32 are varied also depending on the positions and number of the first fiducial marks 22 formed on the multilayer reflective film 21. As described later, in this invention, there is no particular limitation on each number of the first and second fiducial marks. Each number of the first and second fiducial marks is required to be at least three, but may be three or more.

Further, the shape, size, and the like of the alignment region 32 are not particularly required to be limited as long as at least the area including the first fiducial mark 22 formed on the multilayer reflective film 21 is exposed in the alignment region 32, and the first fiducial mark 22 can be detected by a defect inspection device used for performing defect inspection of a substrate 20 with a multilayer reflective film.

For example, as illustrated in FIG. 1, the alignment region 32 can be formed into an L-shape adjacent to the corner of the pattern formation region. A length $L_1$ in a lateral direction of an outer peripheral portion of the L-shape can be set to from 4.0 mm to 8.0 mm, and a length $L_2$ in a longitudinal direction thereof can be set to from 4.0 mm to 8.0 mm. Further, a width W of the L-shape can be set to from 1.0 mm to 4.0 mm.

In the reflective mask blank 30 according to the first embodiment, the alignment region 32 is formed in the outer peripheral edge region of the pattern formation region, for example, by removing a part of the absorber film 31 so that the multilayer reflective film 21 of the area including the first fiducial mark 22 formed on the multilayer reflective film 21 is exposed in the alignment region 32. Therefore, it is possible to perform defect management of the reflective mask blank 30 through use of the alignment region 32. That is, the relative coordinates between the first fiducial mark 22 described above and the second fiducial mark 42 to be described later can be managed through use of the first fiducial mark 22 formed in the alignment region 32. As a result, defect information (second defect map) with reference to the second fiducial mark 42 can be obtained from defect information (first defect map) with reference to the first fiducial mark 22.

Further, when the defect management of the reflective mask blank 30 is performed through use of an actinic blank inspection (ABI) device, the multilayer reflective film 21 is exposed in the alignment region 32, and hence the first fiducial mark 22 can be detected with high accuracy. Thus, the relative coordinates between the first fiducial mark 22 and the second fiducial mark 42 can be managed with high accuracy, and as a result, the defect management of the reflective mask blank 30 with reference to the second fiducial mark 42 can be satisfactorily performed. It is suitable that, in the reflective mask blank 30 according to the first embodiment of this invention, the first fiducial mark 22 and the second fiducial mark 42 be inspected through use of, for example, a defect inspection device such as the above-mentioned ABI device using inspection light having a wavelength of less than 100 nm (wavelength close to a wavelength of a light source of exposure light (for example, EUV light)).

Further, the defect inspection of the first fiducial mark 22 as well as the substrate 20 with a multilayer reflective film can be performed on the substrate 20 with a multilayer reflective film in which the absorber film 31 has not been formed (see FIG. 2 and FIG. 6(a)). With this, defect coordinates obtained by the defect inspection of the substrate 20 with a multilayer reflective film can be matched with the coordinates of the first fiducial mark 22 obtained with reference to the second fiducial mark 42, and hence it is not required to perform coordinate transformation between the defect information on the substrate 20 with a multilayer reflective film and the defect information on the first fiducial mark 22, which is advantageous.

Next, the first and second fiducial marks 22 and 42 are described.

Figure 3:
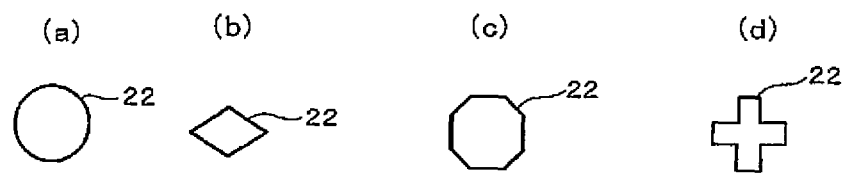
FIG. 3 includes views for illustrating shape examples of a first fiducial mark.
Figure 4:
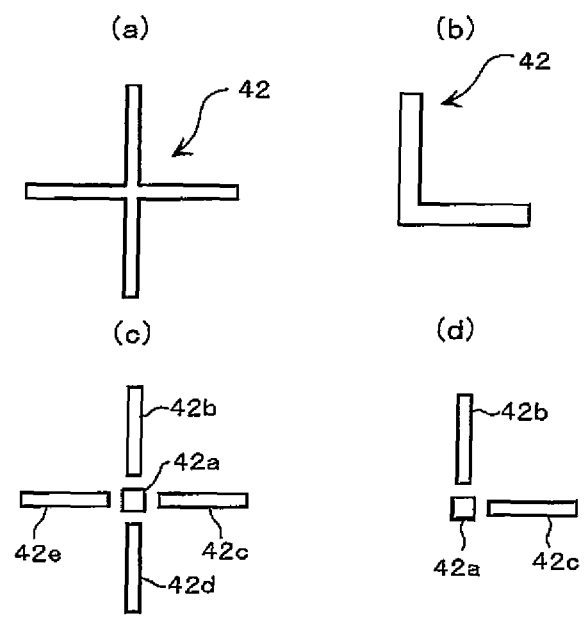
FIG. 4 includes views for illustrating shape examples of a second fiducial mark.
Figure 5:
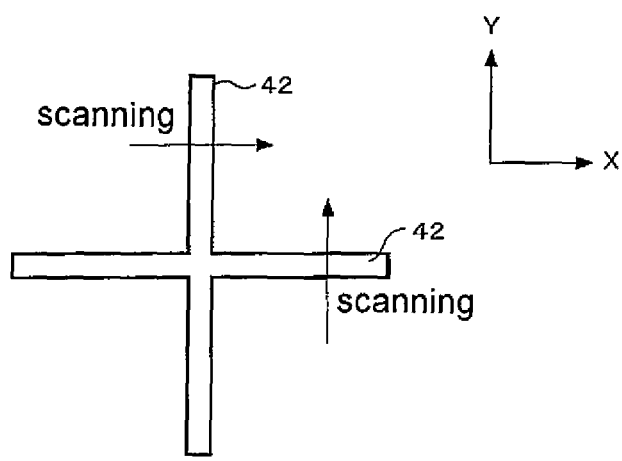

FIG. 3 is a diagram for illustrating several shapes of the first fiducial mark 22. FIG. 4 is a diagram for illustrating several shapes of the second fiducial mark 42. Further, FIG. 5 is a view for illustrating a method of determining a reference point through use of the second fiducial mark 42.

In the above-mentioned embodiment, as one example, the alignment regions 32 are formed in four portions in the vicinity of the corners of the reflective mask blank 30. The first fiducial mark 22 is formed on the multilayer reflective film 21 in the alignment region 32. It is suitable that each of the first fiducial marks 22 be formed on a border line of a region (see FIG. 2) surrounded by a broken line A on a main surface of the substrate 20 with a multilayer reflective film, which corresponds to the pattern formation region on the main surface of the reflective mask blank 30, or on an outer side of the region. However, it is not preferred to form the first fiducial mark 22 excessively closely to the substrate outer peripheral edge because there is a risk in that the first fiducial mark 22 may cross a recognition mark of another kind.

The first fiducial mark 22 serves as a reference of a defect position in defect information. It is preferred that the first fiducial mark 22 have a point-symmetric shape. Further, for example, when the above-mentioned ABI device or the like using, as defect inspection light, light having a short wavelength of less than 100 nm is used for performing defect inspection, it is preferred that the first fiducial mark 22 have a portion with a width of 30 nm or more and 1,000 nm or less in a scanning direction of the defect inspection light.

In FIG. 3, there are illustrated several shapes of the first fiducial mark 22, and a circular fiducial mark as illustrated in FIG. 3(a) is a typical example. Further, the first fiducial mark 22 may have, for example, a rhombic shape as illustrated in FIG. 3(b), an octagonal shape as illustrated in FIG. 3(c), or a cross-like shape as illustrated in FIG. 3(d). Further, although not shown, the first fiducial mark may have a shape of a square or a square having rounded corners. This invention is not limited to the above-mentioned examples of the first fiducial mark.

When the first fiducial mark 22 has a point-symmetric shape, for example, displacement of a reference point of a defect position determined by scanning of the defect inspection light can be reduced, and a variation in defect detection position inspected based on the first fiducial mark 22 can be decreased.

In FIG. 4, there are illustrated several shapes of the second fiducial mark 42, and a fiducial mark having a cross-like shape as illustrated in FIG. 4(a) is a typical example. Further, the second fiducial mark 42 can also be, for example, a fiducial mark having an L-shape as illustrated in FIG. 4(b), a fiducial mark in which four auxiliary marks 42b to 42e are arranged on the periphery of a main mark 42a as illustrated in FIG. 4(c), or a fiducial mark in which the two auxiliary marks 42b and 42c are arranged on the periphery of the main mark 42a as illustrated in FIG. 4(d). This invention is not limited to the above-mentioned examples of the second fiducial mark.

Further, it is preferred that the cross-like shape of FIG. 4(a), the L-shape of FIG. 4(b), and the auxiliary marks 42b to 42e (42b and 42c) arranged on the periphery of the main mark 42a as illustrated in FIG. 4(c) and FIG. 4(d) be arranged along the scanning direction of the defect inspection light or an electron beam drawing device. In particular, it is suitable that the cross-like shape of FIG. 4(a), the L-shape of FIG. 4(b), and the auxiliary marks 42b to 42e (42b and 42c) include a rectangular shape having a long side perpendicular to the scanning direction of the defect inspection light or the electron beam drawing device and a short side parallel thereto (see, for example, FIG. 5). When the second fiducial mark includes a rectangular shape having a long side perpendicular to the scanning direction of the defect inspection light or the electron beam and a short side parallel thereto, the second fiducial mark can be reliably detected by scanning of the defect inspection device or the electron beam drawing device, and hence the position of the second fiducial mark with respect to the first fiducial mark can be easily identified. In this case, it is desired that the long side of the second fiducial mark have a length that can be detected by the smallest possible number of scans of the defect inspection device or the electron beam drawing device. When the above-mentioned ABI device or the like is used for performing defect inspection, it is desired that the long side of the second fiducial mark have a length of, for example, 100 µm or more and 1,500 µm or less.

Further, in the first embodiment, the first and second fiducial marks 22 and 42 each form a recessed shape (sectional shape) having a desired depth in the multilayer reflective film 21 or the absorber film 31, for example, by indentation (punching) through use of a micro-indenter or a focused ion beam. However, the sectional shape of the first and second fiducial marks 22 and 42 is not limited to the recessed shape, and may be a protruding shape. It is only required that the first and second fiducial marks 22 and 42 have a sectional shape that can be detected by the defect inspection device or the electron beam drawing device with satisfactory accuracy.

The above description of the first and second fiducial marks 22 and 42 with reference to FIG. 3 to FIG. 5 is also applied to second and third embodiments of this invention to be described later.

In the above-mentioned embodiment, description has been given of the case in which the first fiducial mark 22 serving as a reference of defect information is formed in the alignment region 32, but the element serving as a reference of defect information is not limited to the fiducial mark. When an actual defect that can be subjected to alignment with inspection light of the defect inspection device is present in the alignment region 32, the coordinates of the actual defect with reference to the second fiducial mark 42 can be detected when the alignment region 32 is inspected. In the case of this embodiment, when the substrate 20 with a multilayer reflective film is subjected to defect inspection, and an actual defect is detected in the outer peripheral edge region of the pattern formation region, it is only required that a region including the actual defect on the multilayer reflective film 21 be formed as the alignment region 32 after the absorber film 31 is formed.

As described above, in the related art, even when an attempt is made to perform defect inspection with high accuracy through use of the defect inspection device, for example, the above-mentioned ABI device capable of detecting a minute defect, the reflectance of EUV light on the absorber film is low, and hence the signal intensity of a defect is small, with the result that it has been difficult to acquire, for example, defect information with satisfactory accuracy containing defect position information in the absorber film.

In contrast, in the reflective mask blank according to the first embodiment of this invention, as described above, the alignment region 32 is formed in the outer peripheral edge region of the pattern formation region so that the multilayer reflective film 21 of the area including, for example, the first fiducial mark 22 serving as a reference of defect information formed on the multilayer reflective film is exposed in the alignment region. Therefore, the defect management with high accuracy of the reflective mask blank can be performed by alignment through use of the alignment region 32, more specifically, through use of, for example, the first fiducial mark 22 formed in the alignment region 32.

Method of Manufacturing Reflective Mask Blank According to First Embodiment

Next, a method of manufacturing the above-mentioned reflective mask blank according to the first embodiment of this invention is described.

As described in the above-mentioned Configuration 1, a method of manufacturing the reflective mask blank according to the first embodiment of this invention is a method of manufacturing a reflective mask blank including at least a multilayer reflective film, which is configured to reflect EUV light and is formed on a substrate, and an absorber film, which is configured to absorb the EUV light and is formed on the multilayer reflective film. The method includes: forming the multilayer reflective film on the substrate to form a substrate with a multilayer reflective film; subjecting the substrate with a multilayer reflective film to defect inspection; forming the absorber film on the multilayer reflective film of the substrate with a multilayer reflective film; forming a reflective mask blank in which an alignment region is formed in an outer peripheral edge region of a pattern formation region by removing the absorber film so that the multilayer reflective film of an area including an element serving as a reference of defect information on the multilayer reflective film is exposed in the alignment region; and performing defect management of the reflective mask blank through use of the alignment region.

FIG. 6 is a diagram for illustrating the manufacturing steps for a reflective mask blank and a reflective mask in the first embodiment of this invention. Now, description is given in accordance with the steps illustrated in FIG. 6.

First, the multilayer reflective film 21, which is configured to reflect, for example, EUV light that is exposure light, is formed on the glass substrate 10 to manufacture the substrate 20 with a multilayer reflective film (see FIG. 6(a)).

In the case of EUV exposure, as a substrate, the glass substrate 10 is preferred, and in particular, in order to prevent distortion of a pattern caused by heat during exposure, a substrate having a low thermal expansion coefficient within a range of $0\pm1.0\times10^{-7}/°$ C., more preferably within a range of $0\pm0.3\times10^{-7}/°$ C. is preferably used. As a material having a low thermal expansion coefficient within this range, for example, $SiO_2$—$TiO_2$-based glass, multicomponent-based glass ceramics, or the like can be used.

A main surface of the glass substrate 10 on which the transfer pattern is to be formed is processed so as to have high flatness at least from the viewpoint of improvement of pattern transfer accuracy and position accuracy. In the case of EUV exposure, in a region of 142 mm×142 mm of the main surface of the glass substrate 10 on which the transfer pattern is to be formed, the flatness is preferably 0.1 μm or less, particularly preferably 0.05 μm or less. Further, a main surface on a side opposite to the side on which the transfer pattern is to be formed is a surface subjected to electrostatic chuck at a time of setting in an exposure device, and in a region of 142 mm×142 mm, the flatness is 0.1 μm or less, preferably 0.05 μm or less.

Further, as described above, a material having a low thermal expansion coefficient, for example, $SiO_2$—$TiO_2$-based glass, is preferably used as the glass substrate 10, but it is difficult to achieve high smoothness with a root-mean-square roughness (Rq) of, for example, 0.1 nm or less as surface roughness in such glass material by precision polishing. Therefore, in order to reduce the surface roughness of the glass substrate 10 or to reduce defects of the surface of the glass substrate 10, an underlying layer may be formed on the surface of the glass substrate 10. It is not required for a material for such underlying layer to have light transmittance with respect to exposure light, and a material that enables high smoothness to be obtained at a time when the surface of the underlying layer is subjected to precision polishing and enables satisfactory defect quality to be obtained is preferably selected. For example, Si or a silicon compound containing Si (for example, $SiO_2$ or SiON) enables high smoothness to be obtained at a time of precision polishing and enables satisfactory defect quality to be obtained, and hence is preferably used as the material for the underlying layer. As the material for the underlying layer, Si is particularly preferred.

It is suitable that the surface of the underlying layer be a surface subjected to precision polishing so as to have flatness required as the surface for a reflective mask blank. It is desired that the surface of the underlying layer be subjected to precision polishing so that the root-mean-square roughness (Rq) is 0.15 nm or less, particularly preferably 0.1 nm or less. Further, in consideration of the effect on the surface of the multilayer reflective film 21 to be formed on the underlying layer, it is desired that the surface of the underlying layer be subjected to precision polishing so that Rmax/Rq is preferably from 2 to 10, particularly preferably from 2 to 8 in a relationship with a maximum height (Rmax).

It is preferred that the thickness of the underlying layer fall within a range of, for example, from 10 nm to 300 nm.

The multilayer reflective film 21 is a multilayer film in which low refractive index layers and high refractive index layers are alternately laminated, and in general, a multilayer film in which thin films of a heavy element or a compound thereof and thin films of a light element or a compound thereof are alternately laminated by from about 40 periods to about 60 periods is used.

For example, as the multilayer reflective film for EUV light having a wavelength of from 13 nm to 14 nm, a Mo/Si period laminated film in which Mo films and Si films are alternately laminated by about 40 periods is preferably used. Other examples of the multilayer reflective film to be used in a region of EUV light include a Ru/Si period multilayer film, a Mo/Be period multilayer film, a Mo compound/Si compound period multilayer film, a Si/Nb period multilayer film, a Si/Mo/Ru period multilayer film, a Si/Mo/Ru/Mo period multilayer film, and a Si/Ru/Mo/Ru period multilayer film. It is only required that the material be appropriately selected in accordance with an exposure wavelength.

In general, in order to protect the multilayer reflective film at a time of patterning or pattern correcting of the absorber film, it is preferred that a protective film (sometimes also referred to as "capping layer" or "buffer film") be formed on the multilayer reflective film 21. As a material for the protective film, besides silicon, ruthenium or a ruthenium compound containing one or more elements selected from niobium, zirconium, and rhodium in ruthenium is used, and in addition, a chromium-based material may be used.

Further, it is preferred that the thickness of the protective film fall within a range of, for example, from about 1 nm to about 5 nm.

There is no particular limitation on the above-mentioned methods of forming the underlying layer, the multilayer reflective film 21, and the protective film, and in general, an ion beam sputtering method, a magnetron sputtering method, or the like is suitable.

In the following, as one mode of the substrate 20 with a multilayer reflective film, as described above, the glass substrate 10 having the multilayer reflective film 21 formed thereon as illustrated in FIG. 6(a) is described. However, in this invention, it is intended that the substrate with a multilayer reflective film encompasses a mode in which the multilayer reflective film 21 and the protective film are successively formed on the glass substrate 10, and a mode in which the underlying layer, the multilayer reflective film 21, and the protective film are formed on the glass substrate 10 in the stated order.

Next, the above-mentioned first fiducial marks 22 are formed on the substrate 20 with a multilayer reflective film manufactured as described above. As described above, each of the first fiducial marks 22 to be formed on the substrate 20 with a multilayer reflective film is formed in the alignment region of the reflective mask blank manufactured from the substrate with a multilayer reflective film. The first fiducial mark 22 has already been described in detail, and hence overlapping description thereof is omitted.

In this case, the first fiducial marks 22 each having, for example, the shape as illustrated in FIG. 3(a) described above are formed at predetermined positions on the multilayer reflective film 21 of the substrate 20 with a multilayer reflective film, for example, by indentation (punching) through use of a micro-indenter (see FIG. 6(a)).

A method of forming the first fiducial marks 22 is not limited to the above-mentioned method using the micro-indenter. For example, when the sectional shape of the fiducial mark is a recessed shape, the fiducial mark can be formed, for example, by forming a recessed portion through use of a focused ion beam, photolithography, or laser light, by forming a machining mark through scanning of a diamond needle, or by embossing through use of an imprint method.

When the sectional shape of the fiducial mark is a recessed shape, from the viewpoint of improving detection accuracy with defect inspection light, it is preferred that the sectional shape be formed so as to be enlarged from a bottom portion of the recessed shape to a surface side.

Further, as described above, it is suitable that the first fiducial mark 22 be formed on a border line of the pattern formation region on the main surface of the substrate 20 with a multilayer reflective film or at any position on an outer side of the pattern formation region (see FIGS. 1 and 2). In this case, the fiducial mark may be formed with reference to an edge, or the formation position of the fiducial mark may be identified with coordinate measurement equipment after the fiducial mark is formed.

For example, when the first fiducial mark 22 is processed with a focused ion beam (FIB), the edge of the substrate with a multilayer reflective film can be recognized in a secondary electron image, a secondary ion image, or an optical image. Further, when the fiducial mark is processed by another method (for example, indentation), the edge of the substrate with a multilayer reflective film can be recognized in an optical image. For example, edge coordinates in eight portions of four sides of the substrate with a multilayer reflective film are confirmed and subjected to tilt correction to determine an origin (0, 0). The origin in this case can be suitably set, and may be a corner portion or a center of the substrate. The fiducial mark is formed with an FIB at a predetermined position from the origin set with reference to an edge.

When the fiducial mark formed with reference to an edge is detected by the defect inspection device, formation position information on the fiducial mark, that is, the distance from the edge, is known. Therefore, it is possible to easily identify the fiducial mark formation position.

Further, a method of identifying the fiducial mark formation position with the coordinate measurement equipment can also be applied after the first fiducial mark 22 is formed at any position on the multilayer reflective film 21. The coordinate measurement equipment is configured to measure the formation coordinates of the fiducial mark with reference to an edge. For example, a high-accuracy pattern position measurement device (LMS-IPR04 manufactured by KLA-Tencor Corporation) can be used, and identified fiducial mark formation coordinates serve as formation position information on the fiducial mark.

Next, the substrate 20 with a multilayer reflective film having the first fiducial marks 22 formed thereon, which is manufactured as described above, is subjected to defect inspection. That is, the first fiducial marks 22 as well as the substrate 20 with a multilayer reflective film are subjected to defect inspection by the defect inspection device to acquire a defect detected by the defect inspection and position information thereon, to thereby acquire defect information including the first fiducial marks 22. Further, the defect inspection in this case is performed on at least the entire surface of the pattern formation region.

Next, the absorber film 31, which is configured to absorb EUV light, is formed on the entire surface of the multilayer reflective film 21 in the substrate 20 with a multilayer reflective film (on the protective film when the multilayer reflective film has the protective film on the surface thereof) to manufacture a reflective mask blank (see FIG. 6(*b*)).

Although not shown, a rear surface conductive film may be formed on a surface of the glass substrate 10 opposite to the surface on which the multilayer reflective film and the like are formed.

It is only required that the absorber film 31 have a function of absorbing, for example, EUV light that is exposure light, and have a desired reflectance difference between reflected light from the multilayer reflective film 21 (protective film when the multilayer reflective film has the protective film on the surface thereof) and reflected light from an absorber film pattern 31*a* in a reflective mask 40 (see FIG. 6(*d*)) manufactured through use of the reflective mask blank. For example, the reflectance of the absorber film 31 with respect to the EUV light is selected from a range of 0.1% or more and 40% or less. Further, in addition to the reflectance difference, the absorber film 31 may have a desired phase difference between the reflected light from the multilayer reflective film 21 (protective film when the multilayer reflective film has the protective film on the surface thereof) and the reflected light from the absorber film pattern 31*a*. When the absorber film 31 has a desired phase difference between the reflected light from the multilayer reflective film 21 (protective film when the multilayer reflective film has the protective film on the surface thereof) and the reflected light from the absorber film pattern 31*a*, the absorber film 31 in the reflective mask blank is sometimes referred to as "phase shift film". When contrast is improved by providing a desired phase difference between the reflected light from the multilayer reflective film 21 (protective film when the multilayer reflective film has the protective film on the surface thereof) and the reflected light from the absorber film pattern 31*a*, the phase difference is preferably set to fall within a range of 180±10°, and the reflectance of the absorber film 31 is preferably set to 3% or more and 40% or less.

The absorber film 31 may have a single-layer structure or a laminate structure. When the absorber film 31 has a laminate structure, the absorber film 31 may be a laminated film of the same material or a laminated film of different kinds of materials. The laminated film can have a configuration in which materials and compositions vary gradually and/or continuously in its thickness direction.

As a material for the absorber film 31, for example, a simple substance of tantalum (Ta) or a material containing Ta is preferably used. As the material containing Ta, a material containing Ta and B, a material containing Ta and N, a material containing Ta and B, and further at least one of O and N, a material containing Ta and Si, a material containing Ta, Si, and N, a material containing Ta and Ge, a material containing Ta, Ge, and N, a material containing Ta and Pd, a material containing Ta and Ru, or the like is used. Further, as materials other than Ta, there may be given a simple substance of Cr or a material containing Cr, a simple substance of Ru or a material containing Ru, a simple substance of Pd or a material containing Pd, and a simple substance of Mo or a material containing Mo. When the absorber film 31 is a laminated film, the absorber film 31 can have a laminate structure including a combination of the above-mentioned materials.

It is preferred that the absorber film 31 have a thickness within a range of, for example, from about 30 nm to about 100 nm. There is no particular limitation on a method of forming the absorber film 31, and in general, a magnetron sputtering method, an ion beam sputtering method, or the like is suitable.

Next, in a predetermined portion of the surface of the above-mentioned reflective mask blank, specifically, in an area including the first fiducial mark 22 formed on the substrate 20 with a multilayer reflective film, the alignment region 32 is formed by removing the absorber film 31 (see FIG. 6(c)). The alignment region 32 is formed into a shape and a size so that the multilayer reflective film 21 of the area including the first fiducial mark 22 formed on the multilayer reflective film 21 is exposed. Further, the second fiducial mark 42 is formed in the vicinity of the first fiducial mark 22 in an upper portion of the absorber film 31 (see FIG. 6(c)).

As a method of removing the absorber film 31 corresponding to areas for forming the alignment region 32 and the second fiducial mark 42, for example, photolithography is suitably applied. Specifically, a predetermined resist pattern (pattern in which a resist is not formed in the areas corresponding to the alignment region and the second fiducial mark) is formed on the absorber film 31, and the absorber film corresponding to the alignment region and the second fiducial mark is subjected to dry etching through use of the resist pattern as a mask. Thus, the absorber film 31 corresponding to the area is removed to form the alignment region 32 and the second fiducial mark 42. In this case, as an etching gas, the same etching gas as that used for patterning of the absorber film 31 may be used.

In the manner described above, the reflective mask blank 30 is manufactured in which the alignment region 32 and the second fiducial mark 42 are formed in the outer peripheral edge region of the pattern formation region by removing the absorber film 31 so that the multilayer reflective film 21 of the area including the first fiducial mark 22 is exposed in the alignment region 32 (see FIG. 6(c)).

Next, the alignment region 32, which includes the first fiducial mark 22, and the second fiducial mark 42, which are produced as described above are inspected through use of the same inspection light as that of the inspection device used for performing the defect inspection of the multilayer reflective film.

In this case, the first fiducial mark 22 formed in the above-mentioned alignment region 32 is inspected with reference to the second fiducial mark 42 to detect position coordinates of the first fiducial mark 22 with reference to the second fiducial mark 42. After that, defect information (first defect map) with reference to the first fiducial mark 22 is created based on the defect information on the substrate 20 with a multilayer reflective film obtained by the above-mentioned defect inspection. Then, the defect information (first defect map) is converted into defect information (second defect map) with reference to the second fiducial mark through use of the coordinates of the first fiducial mark 22 with reference to the second fiducial mark 42. It is suitable that the first fiducial mark 22 and the second fiducial mark 42 be inspected through use of the defect inspection device capable of detecting a minute defect with high accuracy, for example, the above-mentioned ABI device.

In the reflective mask blank 30 according to the first embodiment, the alignment region 32, in which the multilayer reflective film 21 of the area including the first fiducial mark 22 is exposed, is formed in the outer peripheral edge region of the pattern formation region. Therefore, the defect management of the reflective mask blank 30 can be performed through use of the alignment region 32. That is, relative coordinates between the first fiducial mark 22 and the second fiducial mark 42 can be managed through use of the alignment region 32. As a result, the defect information (second defect map) with reference to the second fiducial mark 42 can be obtained from the defect information (first defect map) with reference to the first fiducial mark 22. The absorber film 31 is formed on the multilayer reflective film 21, and hence a defect of the multilayer reflective film 21 is also reflected onto the absorber film 31. Therefore, the defect of the multilayer reflective film 21 can be managed with high accuracy with reference to the second fiducial mark 42 through the alignment region 32. When the defect management of the reflective mask blank 30 is performed, even a minute defect can be detected with high accuracy, in particular, through use of the ABI device, and further, defect information with satisfactory accuracy can be obtained.

Further, the defect inspection of the surface of the reflective mask blank 30 is not required be performed, but in order to perform the defect management with higher accuracy, entire surface inspection and partial inspection in which an inspection time is shortened can also be performed.

In the above-mentioned embodiment, description has been given of the reflective mask blank in which the first fiducial mark 22 serving as a reference of the defect information is formed in the alignment region 32. However, as described above, when an actual defect that can be subjected to alignment with inspection light of the defect inspection device is present in the alignment region 32, the coordinates of the actual defect with reference to the second fiducial mark 42 can be detected when the alignment region 32 is inspected.

As described above, in the reflective mask blank 30 obtained by the manufacturing method according to the first embodiment of this invention, the alignment region 32, in which the multilayer reflective film of the area including, for example, the first fiducial mark 22 is exposed, is formed in the outer peripheral edge region of the pattern formation region. Therefore, the defect management with high accuracy of the reflective mask blank 30 can be performed through use of the alignment region 32, specifically, for example, through use of the first fiducial mark 22 formed in the alignment region 32. As a result, defect information with satisfactory accuracy containing the defect position information can be acquired.

The reflective mask blank 30 according to the first embodiment of this invention also encompasses a mode in which a hard mask film (sometimes referred to as "etching mask film") is formed on the absorber film 31. The hard mask film has a mask function at a time when the absorber film 31 is patterned, and is formed of a material having etching selectivity different from that of a material for the uppermost layer of the absorber film 31. For example, when the absorber film 31 is formed of a simple substance of Ta or a material containing Ta, the hard mask film can be formed of chromium, a chromium compound, silicon, a silicon compound, or other such material. Examples of the chromium compound include a material containing Cr and at least one element selected from N, O, C, and H. Examples of the silicon compound include a material containing Si and at least one element selected from N, O, C, and H, and materials such as metallic silicon (metal silicide) and a metal silicon compound (metal silicide compound) in which metal is contained in silicon or a silicon compound. Examples of the metal silicon compound include a material containing metal, Si, and at least one element selected from N, O, C, and H. Further, when the absorber film 31 is a laminated film in which a material containing Ta and a material containing Cr are laminated in the stated order from the side of the multilayer reflective film 21, silicon, a silicon compound, metal silicide, a metal silicide compound, or the like, which has etching selectivity different from that of the material containing Cr, can be selected as a material for the hard mask film.

Further, the reflective mask blank 30 according to the first embodiment of this invention can also have a configuration in which the absorber film is formed of a laminated film of the uppermost layer and the other layers, which are made of materials having a difference in etching selectivity, and the uppermost layer serves as the hard mask film for the other layers.

As described above, the absorber film 31 in the reflective mask blank 30 according to the first embodiment of this invention is not limited to a single-layer film, and can be formed of a laminated film of the same material or a laminated film of different kinds of materials. Further, the absorber film 31 can be formed of a laminated film of the absorber film of the laminated film or the single-layer film and the hard mask film as described above.

Further, the reflective mask blank 30 according to the first embodiment of this invention can also encompass a mode in which a resist film is formed on the absorber film 31. Such resist film is used for patterning the absorber film in the reflective mask blank by photolithography.

Further, when the resist film is formed on the absorber film 31 through intermediation of the hard mask film or formed directly on the absorber film 31, the shape of the second fiducial mark 42 is transferred onto the resist film. Then, the second fiducial mark 42 transferred onto the resist film has contrast with respect to electron beam scanning by the electron beam drawing device, and can be detected with an electron beam. In this case, the relative coordinates between the first fiducial mark 22 and the second fiducial mark 42 are managed, and hence drawing with high accuracy can be performed even when the shape of the first fiducial mark 22, which is relatively smaller than that of the second fiducial mark 42, is not transferred onto the resist film.

In order to further improve the contrast with respect to electron beam scanning, the resist film may not be formed on the area including the second fiducial mark 42, or the resist film on the area including the second fiducial mark 42 may be removed.

Reflective Mask According to First Embodiment

This invention also provides a reflective mask on which the absorber film in the reflective mask blank having the above-mentioned configuration is patterned, and a manufacturing method therefor.

Specifically, a resist for electron beam drawing is applied onto the above-mentioned reflective mask blank 30 and baked to form a resist film. The resist film is subjected to drawing and development through use of the electron beam drawing device to form a resist pattern corresponding to the transfer pattern on the resist film. After that, the absorber film 31 is patterned through use of the resist pattern as a mask to form the absorber film pattern 31a, to thereby manufacture the reflective mask 40 (see FIG. 6(d)).

As a method of patterning the absorber film 31 serving as the transfer pattern in the reflective mask blank 30, photolithography is most suitable. When the reflective mask is manufactured through use of the reflective mask blank having a configuration including the above-mentioned hard mask film, the hard mask film may be finally removed. However, when the hard mask film, if any remains, does not affect the function of the reflective mask, the hard mask film may not be particularly removed.

The reflective mask 40 includes at least the multilayer reflective film 21, which is configured to reflect EUV light and is formed on the substrate 10, and the absorber film pattern 31a, which is configured to absorb the EUV light and is formed on the multilayer reflective film 21. The alignment region 32 is formed in the outer peripheral edge region of the pattern formation region on the main surface of the reflective mask 40 so that the multilayer reflective film 21 of the area including the element serving as a reference of defect information on the multilayer reflective film 21 is exposed in the alignment region 32. Further, the second fiducial mark 42 for performing alignment in the electron beam drawing step in manufacturing of a mask, which serves as a reference of the first fiducial mark 22, is formed in the vicinity of the alignment region 32 in the absorber film 31. The second fiducial mark 42 is formed so as to be relatively larger than the first fiducial mark 22.

The absorber film 31 is patterned with reference to the second fiducial mark 42 based on the above-mentioned defect information with reference to the second fiducial mark 42.

In this invention, as described above, the defect management of the reflective mask blank can be performed with high accuracy by acquiring the defect information with satisfactory accuracy containing the defect position information on the multilayer reflective film. Therefore, in manufacturing of a mask, matching with drawing data (mask pattern data) that is designed in advance is performed based on the defect information, and the drawing data can be modified (corrected) with high accuracy so that the effect of a defect is reduced. As a result, a finally manufactured reflective mask in which defects are reduced can be obtained.

Further, a semiconductor device of high quality having less defects can be manufactured by transferring a transfer pattern by exposure onto a resist film on a semiconductor substrate through use of the above-mentioned reflective mask of this invention.

EXAMPLES

Now, the embodiments of this invention are more specifically described by way of Examples.

Example 1

A $SiO_2$—$TiO_2$-based glass substrate (having a size of about 152.0 mm× about 152.0 mm and a thickness of about 6.35 mm) was prepared by gradually polishing a substrate surface with cerium oxide abrasive grains or colloidal silica abrasive grains through use of a double side polisher and treating the substrate surface with fluorosilicic acid having low concentration. The obtained glass substrate had a root-mean-square roughness (Rq) of 0.25 nm as surface roughness. The surface roughness was measured by an atomic force microscope (AFM), and the measurement region was set to 1 μm×1 μm.

Next, a Si film (film thickness: 4.2 nm) and a Mo film (film thickness: 2.8 nm) were laminated on a main surface of the glass substrate by 40 periods through use of an ion beam sputtering device, with the Si film and the Mo film being one period, and a Si film (film thickness: 4 nm) was finally formed on the laminate. Further, a protective film (film thickness: 2.5 nm) made of Ru was formed on the resultant to obtain a substrate with a multilayer reflective film.

Next, first fiducial marks each having a surface shape described below and a recessed sectional shape were formed in predetermined portions of the surface of the multilayer reflective film of the substrate with a multilayer reflective film. The first fiducial marks were formed by indentation (punching) through use of a micro-indenter. Specifically, the first fiducial marks were formed by pressing the micro-indenter against the multilayer reflective film under a predetermined pressure. After the first fiducial marks were formed, the resultant was washed.

In Example 1, each of the first fiducial marks had the above-mentioned circular shape illustrated in FIG. 3(a) having a size of 500 nm in diameter and a depth of 60 nm.

Next, the first fiducial marks as well as the surface of the substrate with a multilayer reflective film were subjected to defect inspection through use of the above-mentioned ABI device. In this defect inspection, defect position information on a protruding portion and a recessed portion and defect size information were acquired, and thus defect information on the first fiducial marks as well as the substrate with a multilayer reflective film was acquired.

Further, the reflectance of the surface of the protective film of the substrate with a multilayer reflective film was evaluated by an EUV reflectometer to be satisfactorily 64%±0.2%.

Next, an absorber film formed of a laminated film of a TaBN film (film thickness: 56 nm) and a TaBO film (film thickness: 14 nm) was formed on the protective film of the substrate with a multilayer reflective film through use of a DC magnetron sputtering device, and a CrN conductive film (film thickness: 20 nm) was formed on a rear surface of the substrate with a multilayer reflective film to obtain a reflective mask blank.

Next, alignment regions and second fiducial marks in which the absorber film was removed were formed in predetermined portions of the surface of the reflective mask blank. Further, the alignment regions were each formed into a shape and a size so that the multilayer reflective film of an area including the first fiducial mark formed on the multilayer reflective film was exposed. The second fiducial marks were each formed into the above-mentioned cross-like shape illustrated in FIG. 4(a). The second fiducial mark had the cross-like shape having a size of 5 μm in width and 550 μm in length and a depth of about 70 nm because the absorber film was completely removed.

In order to remove the absorber film in each of the alignment regions and form the second fiducial marks, photolithography was applied. Specifically, a resist for electron beam drawing was applied onto the reflective mask blank, which had the absorber film formed thereon, by a spin coating method and baked to form a resist film. A predetermined resist pattern corresponding to a region excluding the alignment regions and the second fiducial marks was formed on the absorber film. Through use of the resist pattern as a mask, the TaBO film of the exposed absorber film was removed by etching with fluorine-based gas ($CF_4$ gas) and the TaBN film thereof was removed by etching with chlorine-based gas ($Cl_2$ gas), to thereby form the alignment regions and the second fiducial marks. Further, the resist pattern remaining on the absorber film was removed with hot sulfuric acid to obtain the reflective mask blank having the alignment regions and the second fiducial marks formed thereon.

The first fiducial marks in the alignment regions and the second fiducial marks in the obtained reflective mask blank were inspected by the above-mentioned ABI device, which is the same as that used for defect inspection of the substrate with a multilayer reflective film. In this case, the first fiducial marks were inspected with reference to the second fiducial marks, and position coordinates of the first fiducial marks with reference to the second fiducial marks were detected. Through management of relative coordinates between the second fiducial marks and the first fiducial marks, a defect on the multilayer reflective film can be managed with high accuracy with reference to the second fiducial marks.

As described above, defect information on the reflective mask blank with reference to the second fiducial marks was acquired.

Further, the defect information was corrected to be converted into reference coordinates in the electron beam drawing step by measuring the second fiducial marks with a coordinate measurement device (LMS-IPR04 manufactured by KLA-Tencor Corporation).

Next, an EUV reflective mask was manufactured through use of the EUV reflective mask blank from which the defect information was acquired.

First, a resist for electron beam drawing was applied onto the EUV reflective mask blank by a spin coating method and baked to form a resist film.

In this case, alignment was performed based on the second fiducial marks. Then, matching with mask pattern data that was designed in advance was performed based on the defect information on the EUV reflective mask blank, and the mask pattern was drawn and developed on the above-mentioned resist film through use of an electron beam to form a resist pattern by modifying the drawing data to mask pattern data having no effect on the pattern transfer using an exposure device or by modifying, when it was determined that there was an effect on the pattern transfer, the drawing data to, for example, mask pattern data in which modified pattern data was added so as to cover a defect under the pattern. In Example 1, the defect information containing the defect position information with high accuracy had been acquired, and hence the mask pattern data was able to be modified with high accuracy.

Through use of the resist pattern as a mask, the TaBO film of the absorber film was removed by etching with fluorine-based gas ($CF_4$ gas), and the TaBN film thereof was removed by etching with chlorine-based gas ($Cl_2$ gas), to thereby form an absorber film pattern on the protective film.

Further, the resist pattern remaining on the absorber film pattern was removed with hot sulfuric acid to obtain an EUV reflective mask.

The reflective mask thus obtained was set on the exposure device, and pattern transfer onto a semiconductor substrate having a resist film formed thereon was performed, with the result that the satisfactory pattern transfer was able to be performed without a defect of the transfer pattern caused by the reflective mask.

Reference Example 1

A reflective mask blank was manufactured in the same manner as in Example 1 except that the above-mentioned alignment regions were not formed after the absorber film was formed on the substrate with a multilayer reflective film having the first fiducial marks formed thereon in Example 1 described above.

In the same manner as in Example 1, the substrate with a multilayer reflective film was subjected to defect inspection by the ABI device to acquire defect position information and defect size information. Further, the areas of the absorber film in which the first fiducial marks were formed were inspected by the ABI device, with the result that the first fiducial marks formed on the multilayer reflective film had low contrast in EUV light and were not able to be detected with satisfactory accuracy. Therefore, the accuracy of the acquired defect coordinates was unsatisfactory, and it was difficult to acquire defect information on the reflective mask blank.

Next, an EUV reflective mask was manufactured through use of the EUV reflective mask blank in the same manner as in Example 1.

The obtained EUV reflective mask was set on the exposure device, and pattern transfer onto a semiconductor substrate having a resist film formed thereon was performed, with the result that a transfer pattern defect caused by the reflective mask was observed. The cause for the foregoing was considered as follows. As described above, the accuracy of the defect coordinates of the first fiducial marks was unsatisfactory, and hence it was difficult to acquire defect information on the reflective mask blank. Therefore, in the pattern drawing step, the mask pattern data was not able to be modified with high accuracy based on the defect information on the EUV reflective mask blank, and a defect on the multilayer reflective film was not able to be covered under the absorber film pattern with satisfactory accuracy.

In Example 1 described above, description has been given of the example in which the first fiducial marks were formed by indentation through use of a micro-indenter, but this invention is not limited thereto. As described above, besides this method, the first fiducial marks can be formed, for example, by forming a recessed portion through use of a focused ion beam, photolithography, laser light, or the like, by forming a machining mark through scanning of a diamond needle, or by embossing through use of an imprint method, or the like. Further, in Example 1 described above, description has been given of the example in which the first fiducial marks are formed in the alignment regions, but false defects may be formed in place of the first fiducial marks. Further, actual defects present in the alignment regions may be used.

Now, a second embodiment of this invention is described in detail.

Reflective Mask Blank According to Second Embodiment

Figure 7:
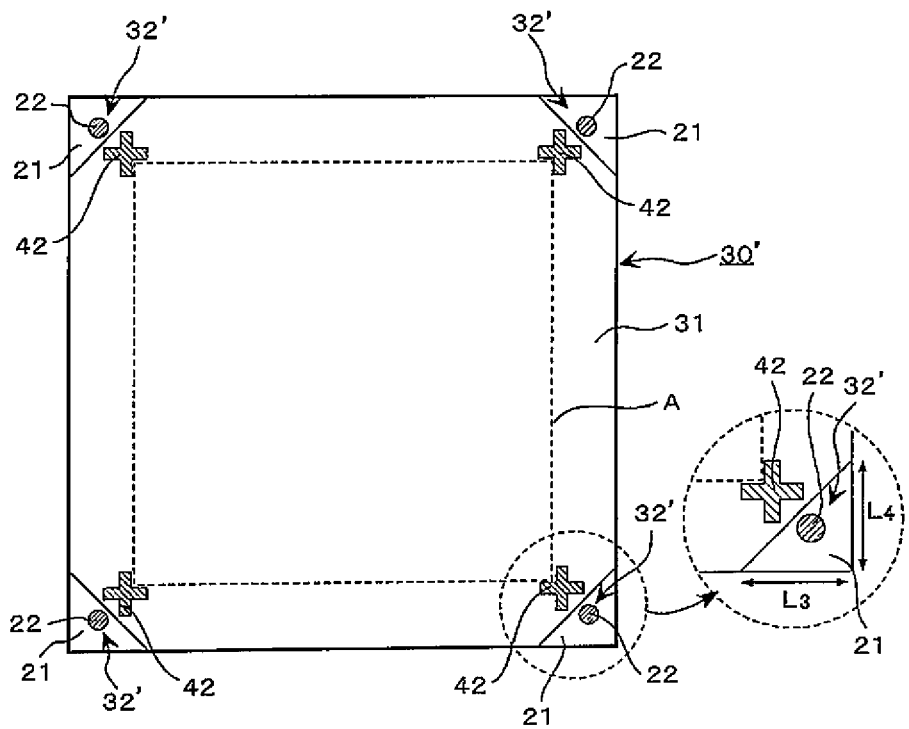
FIG. 7 is a plan view for illustrating a reflective mask blank according to a second embodiment of this invention.
Figure 8:
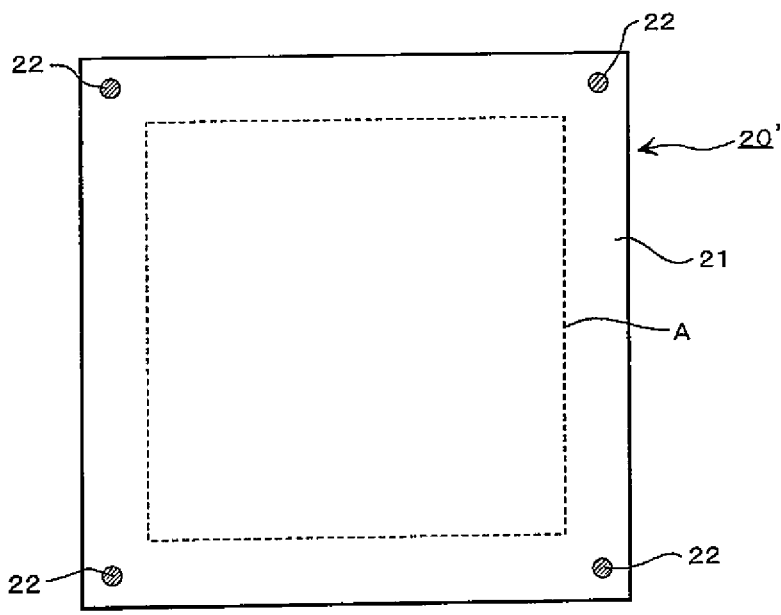
FIG. 8 is a plan view of a substrate with a multilayer reflective film forming the reflective mask blank illustrated in FIG. 7.

FIG. 7 is a plan view for illustrating a reflective mask blank according to the second embodiment of this invention. Further, FIG. 8 is a plan view of a substrate with a multilayer reflective film forming the reflective mask blank illustrated in FIG. 7. Further, FIG. 10 includes schematic sectional views for illustrating manufacturing steps for a reflective mask blank and a reflective mask in the second embodiment of this invention. In the following description, the same components as those described in the first embodiment are denoted by the same reference numerals, and detailed description thereof is sometimes omitted.

Figure 10:
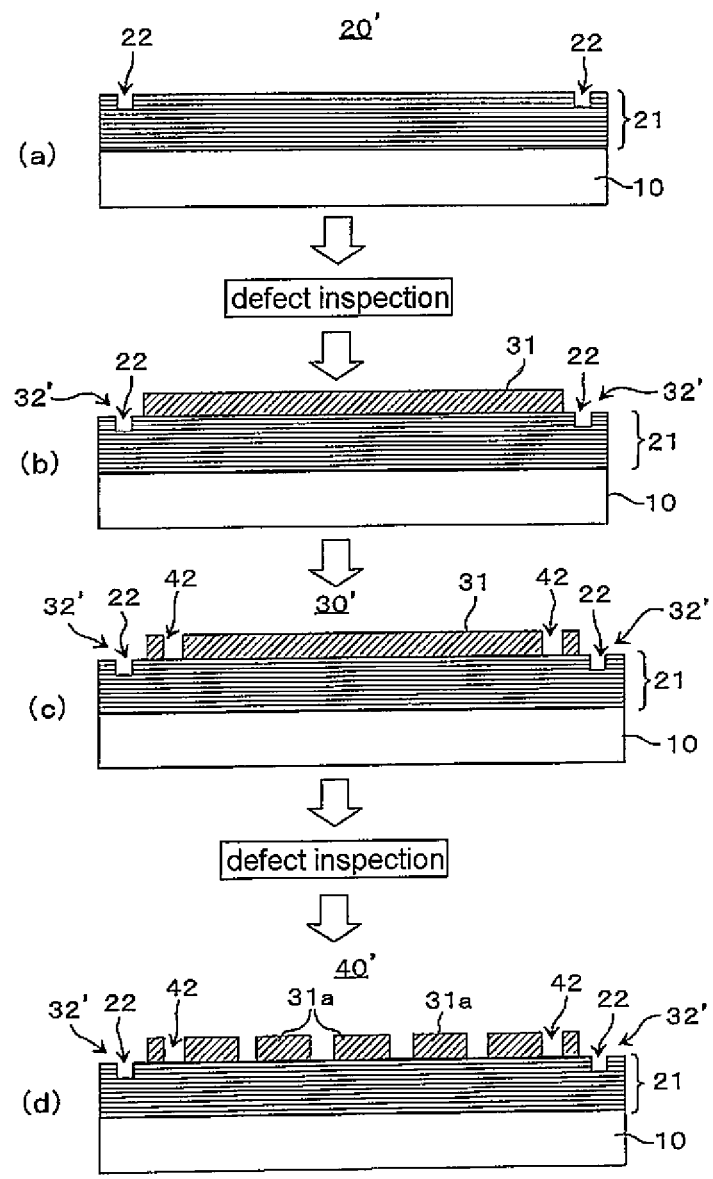
FIG. 10 includes schematic sectional views for illustrating manufacturing steps for a reflective mask blank and a reflective mask in each of the second and third embodiments of this invention.

As illustrated in FIGS. 7 and 10, a reflective mask blank 30' according to the second embodiment of this invention includes at least a multilayer reflective film 21, which is configured to reflect EUV light that is exposure light and is formed on a substrate 10, and an absorber film 31, which is configured to absorb the EUV light and is formed on the multilayer reflective film 21 (see FIG. 10(c)). In an outer peripheral edge region of a pattern formation region (region A surrounded by a broken line in FIG. 7) on a main surface of the reflective mask blank 30', a plurality of alignment regions 32' are formed. The pattern formation region is a region in which a transfer pattern is formed in the absorber film 31. In a substrate having a dimension of six inches on each side (about 152.0 mm× about 152.0 mm), the pattern formation region corresponds to, for example, a region of 132 mm×132 mm. The alignment region 32' is a region in which the multilayer reflective film 21 of an area including a first fiducial mark 22 serving as a reference of defect information on the multilayer reflective film 21 is exposed. In the second embodiment, the first fiducial mark 22 is formed on the multilayer reflective film 21. Further, a second fiducial mark 42 for performing alignment in an electron beam drawing step in manufacturing of a mask, which serves as a reference of the first fiducial mark 22, is formed in the vicinity of the pattern formation region side of the alignment region 32' in the absorber film 31. It is desired that the second fiducial mark 42 be formed so as to be relatively larger than the first fiducial mark 22. That is, it is preferred that the width or the length of the second fiducial mark 42 be larger than that of the first fiducial mark 22, and/or the depth or the height of a sectional shape of the second fiducial mark 42 be larger than that of the first fiducial mark 22.

Further, in the second embodiment, the alignment region 32' and the second fiducial mark 42, which are described above, are formed, as one example, in the outer peripheral edge region of the pattern formation region of the reflective mask blank 30', specifically, in four portions in the vicinity of corners of the reflective mask blank 30'. However, it is only required that the alignment region 32' and the second fiducial mark 42 be formed in the outer peripheral edge region of the pattern formation region, and the formation region thereof is not limited to the vicinity of the corner. In the second embodiment, the alignment region 32' is a region in which the multilayer reflective film 21 of the area including the first fiducial mark 22 formed on the multilayer reflective film 21 is exposed. Therefore, the positions and number of the formed alignment regions 32' are varied also depending on the positions and number of the first fiducial marks 22 formed on the multilayer reflective film 21. In the same manner as in the first embodiment, there is no particular limitation on each number of the first and second fiducial marks. Each number of the first and second fiducial marks is required to be at least three, but may be three or more as in the second embodiment.

Further, the shape, size, and the like of the alignment region 32' are not particularly required to be limited as long as at least the area including the first fiducial mark 22 formed on the multilayer reflective film 21 is exposed in the alignment region 32', and the first fiducial mark 22 can be detected by a defect inspection device used for performing defect inspection of a substrate 20' with a multilayer reflective film. When the absorber film 31 is formed on the multilayer reflective film 21 to obtain the reflective mask blank, the alignment region 32' is formed by forming the absorber film 31 under a state in which, for example, a shielding member is provided so that the absorber film 31 is not formed and the multilayer reflective film 21 is exposed in the alignment region 32'. Therefore, it is suitable that the alignment region 32' be formed in the outer peripheral edge region of the pattern formation region of the reflective mask blank, in particular, in the region including the substrate outer peripheral edge.

For example, in the second embodiment, as illustrated in FIG. 7, the alignment regions 32' are formed in four corner positions of the reflective mask blank 30', respectively, and each of the alignment regions 32' is formed into a triangular shape including two sides of the corner. A length $L_3$ in a lateral direction of an outer peripheral portion of the triangular shape can be set to, for example, from 6.0 mm to 18.0 mm, and a length $L_4$ in a longitudinal direction thereof can be set to, for example, from 6.0 mm to 18.0 mm.

In the reflective mask blank 30' according to the second embodiment, the alignment region 32' is formed in the outer peripheral edge region of the pattern formation region so that the multilayer reflective film 21 of the area including the first fiducial mark 22 formed on the multilayer reflective film 21 is exposed in the alignment region 32' without the absorber film 31 being formed therein. Further, the second fiducial mark 42 for performing alignment in an electron beam drawing step in manufacturing of a mask, which serves as a reference of the first fiducial mark 22, is formed in the vicinity of the pattern formation region side of the alignment region 32' in the absorber film 31 as described above. Thus, the defect management of the reflective mask blank 30' can be performed through use of the alignment region 32'. That is, the relative coordinates between the first fiducial mark 22 and the second fiducial mark 42 can be managed through use of the first fiducial mark 22 formed in the alignment region 32'. As a result, defect information (second defect map) with reference to the second fiducial mark 42 can be obtained from defect information (first defect map) with reference to the first fiducial mark 22.

Further, when the defect management of the reflective mask blank 30' is performed through use of the ABI device described above, the multilayer reflective film 21 is exposed in the alignment region 32', and hence the first fiducial mark 22 can be detected with high accuracy. Thus, the relative coordinates between the first fiducial mark 22 and the second fiducial mark 42 can be managed with high accuracy, and as a result, the defect management of the reflective mask blank 30' with reference to the second fiducial mark 42 can be satisfactorily performed. It is suitable that, in the reflective mask blank 30' according to the second embodiment of this invention, the first fiducial mark 22 and the second fiducial mark 42 be inspected through use of, for example, a defect inspection device such as the above-mentioned ABI device using inspection light having a wavelength of less than 100 nm (wavelength close to a wavelength of a light source of exposure light (for example, EUV light)).

Further, the defect inspection of the first fiducial mark 22 as well as the substrate 20' with a multilayer reflective film can be performed on the substrate 20' with a multilayer reflective film in which the absorber film 31 has not been formed (see FIG. 8 and FIG. 10(*a*)). With this, defect coordinates obtained by the defect inspection of the substrate 20' with a multilayer reflective film can be matched with the coordinates of the first fiducial mark 22 obtained with reference to the second fiducial mark 42, and hence it is not required to perform coordinate transformation between the defect information on the substrate 20' with a multilayer reflective film and the defect information on the first fiducial mark 22, which is advantageous.

The first fiducial mark 22 and the second fiducial mark 42 are as described with reference to FIG. 3 to FIG. 5 in the first embodiment, and hence overlapping description thereof is omitted.

In the second embodiment, the alignment regions 32' are formed, as one example, in four portions of the corners of the reflective mask blank 30', respectively. The first fiducial mark 22 is formed on the multilayer reflective film 21 in the alignment region 32'. As described above, it is suitable that the alignment region 32' be formed in the outer peripheral edge region of the pattern formation region of the reflective mask blank, in particular, in the region including the substrate outer peripheral edge. Therefore, it is suitable that the first fiducial mark 22 to be formed on the multilayer reflective film 21 in the alignment region 32' be also formed on an outer side of the region (see FIG. 8) surrounded by the broken line A on the main surface of the substrate 20' with a multilayer reflective film, which corresponds to the pattern formation region on the main surface of the reflective mask blank 30'. However, it is not preferred that the first fiducial mark 22 be formed excessively closely to the substrate outer peripheral edge because there is a risk in that the first fiducial mark 22 may cross a recognition mark of another kind. From the above-mentioned viewpoint, it is desired that the first fiducial mark 22 (or the alignment region 32' including the fiducial mark) be formed, for example, in a region of from 134 mm×134 mm to 146 mm×146 mm in a substrate having a dimension of six inches on each side (about 152.0 mm× about 152.0 mm).

As described in the first embodiment, the first fiducial mark 22 serves as a reference of a defect position in defect information. Then, it is preferred that the first fiducial mark 22 have a point-symmetric shape. Further, for example, when the above-mentioned ABI device or the like using, as defect inspection light, light having a short wavelength of less than 100 nm is used for performing defect inspection, it is preferred that the first fiducial mark 22 have a portion with a width of 30 nm or more and 1,000 nm or less in a scanning direction of the defect inspection light.

In the second embodiment, the alignment region 32', in which the multilayer reflective film 21 of the area including the first fiducial mark 22 is exposed, is formed in the outer peripheral edge region of the pattern formation region. Therefore, the second fiducial mark 42 serving as a reference of the first fiducial mark 22 is formed in the vicinity of the pattern formation region side of the alignment region 32' in the absorber film 31. In the second embodiment, as one specific example, the second fiducial mark 42 is formed in the vicinity of the substrate corner and in the vicinity of the outer side of the corner of the pattern formation region. However, it is only required that the second fiducial mark 42 be formed in the vicinity of the pattern formation region side of the alignment region 32', and the position of the second fiducial mark 42 is not limited to the embodiment of FIG. 7. For example, it is only required that the second fiducial mark 42 and the first fiducial mark 22 in the alignment region 32' have a positional relationship in which the second fiducial mark 42 and the first fiducial mark 22 fall within a region of 10 mm×10 mm.

Also in the second embodiment described above, description has been given of the case in which the first fiducial mark 22 serving as a reference of defect information is formed in the alignment region 32'. However, when an actual defect that can be subjected to alignment with inspection light of the defect inspection device is present in the alignment region 32', the coordinates of the actual defect with reference to the second fiducial mark 42 can be detected when the alignment region 32' is inspected. That is, in the second embodiment, the actual defect present in the alignment region 32' can also serve as the first fiducial mark 22. In the case of this embodiment, when the substrate with a multilayer reflective film is subjected to defect inspection, and an actual defect is detected in the outer peripheral edge region of the pattern formation region, in the case where the absorber film 31 is formed on the multilayer reflective film 21, it is only required that the absorber film 31 not be formed in the region including the actual defect of the multilayer reflective film 21 and the region be formed as the alignment region 32'.

As described also in the first embodiment, in the related art, even when an attempt is made to perform defect inspection with high accuracy through use of the defect inspection device, for example, the above-mentioned ABI device capable of detecting a minute defect, the reflectance of EUV light on the absorber film is low, and hence the signal intensity of a defect is small, with the result that it has been difficult to acquire defect information with satisfactory accuracy containing defect position information, for example, in the absorber film.

In contrast, also in the reflective mask blank according to the second embodiment of this invention, as described above, the alignment region 32' is formed in the outer peripheral edge region of the pattern formation region so that the multilayer reflective film of the area including the first fiducial mark 22 serving as a reference of the defect information formed on the multilayer reflective film is exposed in the alignment region 32'. Therefore, when alignment is performed through use of the alignment region 32', more specifically, for example, through use of the first fiducial mark 22 formed in the alignment region 32', the defect management with high accuracy of the reflective mask blank can be performed. For example, the relative coordinates between the first fiducial mark 22 and the second fiducial mark 42 can be managed through use of the first fiducial mark 22 formed in the alignment region 32'. Therefore, the defect information (second defect map) with reference to the second fiducial mark 42 can be obtained from the defect information (first defect mark) with reference to the first fiducial mark 22.

Figure 9:
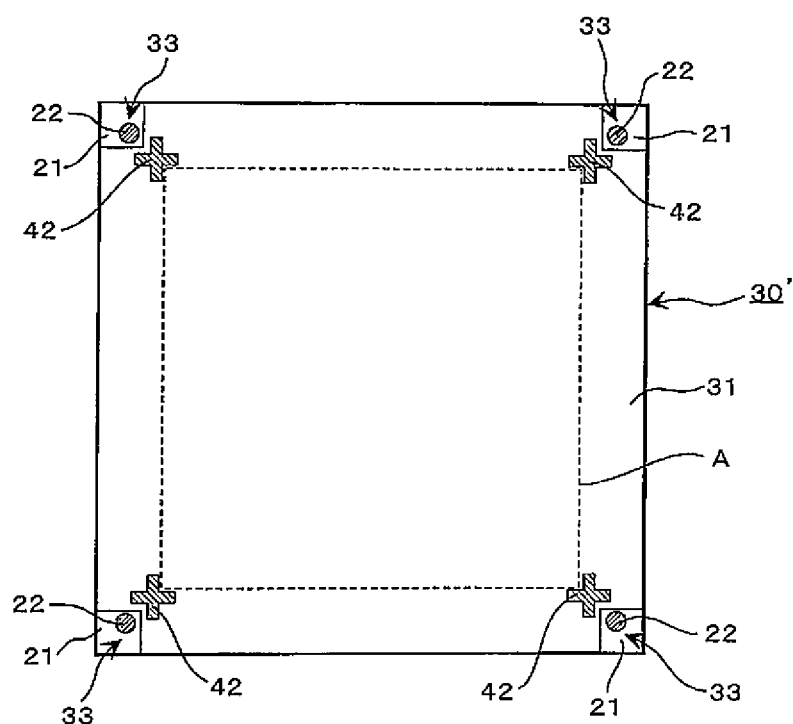
FIG. 9 is a plan view for illustrating a reflective mask blank according to a third embodiment of this invention.

FIG. 9 is a plan view for illustrating a reflective mask blank according to a third embodiment of this invention.

In the embodiment illustrated in FIG. 9, alignment regions 33 each including the first fiducial mark 22 are formed in four portions of corners of the substrate so as to have a rectangular shape including two sides of the corner. A length in a lateral direction of the rectangular region can be set to, for example, from 3.0 mm to 9.0 mm, and a length in a longitudinal direction thereof can also be set to, for example, from 3.0 mm to 9.0 mm.

As described above, the shape, size, and the like of the alignment region 33 are not required to be limited to those of the above-mentioned embodiments as long as the first fiducial mark 22 can be detected by the defect inspection device.

Also in the third embodiment, the second fiducial mark 42 serving as a reference of the first fiducial mark 22 is formed in the vicinity of the pattern formation region side of the alignment region 33 in the absorber film 31.

The other configurations are the same as those in the second embodiment of FIG. 7 described above, and hence overlapping description thereof is omitted.

Also in the third embodiment, the defect management of the reflective mask blank 30' can be performed through use of the above-mentioned alignment region 33. That is, the relative coordinates between the first fiducial mark 22 and the second fiducial mark 42 can be managed through use of the first fiducial mark 22 formed in the alignment region 33. As a result, defect information (second defect map) with reference to the second fiducial mark 42 can be obtained from defect information (first defect map) with reference to the first fiducial mark 22.

Further, when the defect management of the reflective mask blank 30' is performed through use of the ABI device, the multilayer reflective film 21 is exposed in the alignment region 33, and hence the first fiducial mark 22 can be detected with high accuracy. Thus, the relative coordinates between the first fiducial mark 22 and the second fiducial mark 42 can be managed with high accuracy, and as a result, the defect management of the reflective mask blank 30' with reference to the second fiducial mark 42 can be satisfactorily performed.

Method of Manufacturing Reflective Mask Blank According to Each of Second and Third Embodiments Next, a method of manufacturing the above-mentioned reflective mask blank according to the second embodiment of this invention is described. This description may also be applied to the third embodiment.

As described in the above-mentioned Configuration 14, the method of manufacturing the reflective mask blank according to the second embodiment of this invention is a method of manufacturing a reflective mask blank including at least a multilayer reflective film, which is configured to reflect EUV light and is formed on a substrate, and an absorber film, which is configured to absorb the EUV light and is formed on the multilayer reflective film, the method including the steps of:
forming the multilayer reflective film on the substrate to form a substrate with a multilayer reflective film;
subjecting the substrate with a multilayer reflective film to defect inspection; and
forming the absorber film on the multilayer reflective film of the substrate with a multilayer reflective film to form a reflective mask blank;
the forming the absorber film including a step (hereinafter sometimes referred to as "alignment region forming step") of forming, in an outer peripheral edge region of a pattern formation region, an alignment region without forming the absorber film so that the multilayer reflective film of an area including a first fiducial mark serving as a reference of defect information on the multilayer reflective film is exposed in the alignment region,
the method further including the steps of:
forming a second fiducial mark serving as a reference of the first fiducial mark in a vicinity of the pattern formation region side of the alignment region in the absorber film; and
performing defect management of the reflective mask blank through use of the alignment region.

FIG. 10 are sectional views for illustrating manufacturing steps for a reflective mask blank and a reflective mask in the second embodiment of this invention. Now, description is given in accordance with the steps illustrated in FIG. 10.

First, the multilayer reflective film 21, which is configured to reflect, for example, EUV light that is exposure light, is formed on the glass substrate 10 being a substrate to manufacture the substrate 20' with a multilayer reflective film (see FIG. 10(a)).

In the case of EUV exposure, as a substrate, the glass substrate is preferred, and in particular, in order to prevent distortion of a pattern caused by heat during exposure, a substrate having a low thermal expansion coefficient within a range of $0\pm1.0\times10^{-7}/°$ C., more preferably within a range of $0\pm0.3\times10^{-7}/°$ C. is preferably used as in the first embodiment. As a material having a low thermal expansion coefficient within this range, for example, $SiO_2$—$TiO_2$-based glass, multicomponent-based glass ceramics, or the like can be used.

As described in the first embodiment, a main surface of the glass substrate 10 on which the transfer pattern is to be formed is processed so as to have high flatness at least from the viewpoint of improvement of pattern transfer accuracy and position accuracy. In the case of EUV exposure, in a region of 142 mm×142 mm of the main surface of the glass substrate 10 on which the transfer pattern is to be formed, the flatness is preferably 0.1 µm or less, particularly preferably 0.05 µm or less. Further, a main surface on a side opposite to the side on which the transfer pattern is to be formed is a surface subjected to electrostatic chuck at a time of setting in an exposure device, and in a region of 142 mm×142 mm, the flatness is 0.1 µm or less, preferably 0.05 µm or less.

Further, as described above, a material having a low thermal expansion coefficient, for example, $SiO_2$—$TiO_2$-based glass, is preferably used as the glass substrate 10, but it is difficult to achieve high smoothness with a root-mean-square roughness (Rq) of, for example, 0.1 nm or less as surface roughness in such glass material by precision polishing. Therefore, in order to reduce the surface roughness of the glass substrate 10 or to reduce defects of the surface of the glass substrate 10, an underlying layer may be formed on the surface of the glass substrate 10. It is not required for a material for such underlying layer to have light transmittance with respect to exposure light, and a material that enables high smoothness to be obtained at a time when the surface of the underlying layer is subjected to precision polishing and enables satisfactory defect quality to be obtained is preferably selected. For example, Si or a silicon compound containing Si (for example, $SiO_2$ or SiON) enables high smoothness to be obtained at a time of precision polishing and enables satisfactory defect quality to be obtained, and hence is preferably used as the material for the underlying layer. As the underlying layer, Si is particularly preferred.

It is suitable that the surface of the underlying layer be a surface subjected to precision polishing so as to have flatness required as the surface for a reflective mask blank. It is desired that the surface of the underlying layer be subjected to precision polishing so that the root-mean-square roughness (Rq) is 0.15 nm or less, particularly preferably 0.1 nm or less. Further, in consideration of the effect on the surface of the multilayer reflective film 21 to be formed on the underlying layer, it is desired that the surface of the underlying layer be subjected to precision polishing so that Rmax/Rq is preferably from 2 to 10, particularly preferably from 2 to 8 in a relationship with a maximum height (Rmax).

It is preferred that the thickness of the underlying layer fall within a range of, for example, from 10 nm to 300 nm.

As described in the first embodiment, the multilayer reflective film 21 is a multilayer film in which low refractive index layers and high refractive index layers are alternately laminated, and in general, a multilayer film in which thin films of a heavy element or a compound thereof and thin films of a light element or a compound thereof are alternately laminated by from about 40 periods to about 60 periods is used. The specific example of the multilayer reflective film 21 is as described in the first embodiment, and hence description thereof is omitted.

As in the first embodiment, in general, in order to protect the multilayer reflective film at a time of patterning or pattern correcting of the absorber film, it is preferred that a protective film (sometimes also referred to as "capping layer" or "buffer film") be formed on the multilayer reflective film 21. As a material for the protective film, besides silicon, ruthenium or a ruthenium compound containing one or more elements selected from niobium, zirconium, and rhodium in ruthenium is used, and in addition, a chromium-based material may be used. Further, it is preferred that the thickness of the protective film fall within a range of, for example, from about 1 nm to about 5 nm.

As described in the first embodiment, there is no particular limitation on the above-mentioned methods of forming the underlying layer, the multilayer reflective film 21, and the protective film, and in general, an ion beam sputtering method, a magnetron sputtering method, or the like is suitable.

In the following, as a mode of the substrate 20' with a multilayer reflective film, as described above, the glass substrate 10 having the multilayer reflective film 21 formed thereon as illustrated in FIG. 10(a) is described. However, also in the second embodiment, it is intended that the substrate 20' with a multilayer reflective film encompasses a mode in which the multilayer reflective film 21 and the protective film are successively formed on the glass substrate 10, and a mode in which the underlying layer, the multilayer reflective film 21, and the protective film are formed on the glass substrate 10 in the stated order. Further, from the viewpoint of suppressing dust generation in an end portion of the substrate, the multilayer reflective film 21 may not be formed in a region having a predetermined width (for example, about several millimeters) on an inner side from an outer peripheral end portion of the substrate when the multilayer reflective film 21 is formed on the glass substrate 10. The second embodiment also encompasses such mode.

Next, the above-mentioned first fiducial marks 22 are formed on the substrate 20' with a multilayer reflective film manufactured as described above. As described above, each of the first fiducial marks 22 to be formed on the substrate 20' with a multilayer reflective film is formed in the alignment region of the reflective mask blank manufactured from the substrate with a multilayer reflective film. The first fiducial mark 22 has already been described in detail, and hence overlapping description thereof is omitted.

In this case, the first fiducial marks 22 each having, for example, the shape as illustrated in FIG. 3(a) described above are formed at predetermined positions on the multilayer reflective film 21 of the substrate 20' with a multilayer reflective film, for example, by indentation (punching) through use of a micro-indenter (see FIG. 10(a)).

As in the first embodiment, a method of forming the first fiducial marks 22 is not limited to the above-mentioned method using the micro-indenter. For example, when the sectional shape of the fiducial mark is a recessed shape, the fiducial mark can be formed, for example, by forming a recessed portion through use of a focused ion beam, photolithography, or laser light, by forming a machining mark through scanning of a diamond needle, or by embossing through use of an imprint method.

When the sectional shape of the first fiducial mark 22 is a recessed shape, from the viewpoint of improving detection accuracy with defect inspection light, it is preferred that the sectional shape be formed so as to be enlarged from a bottom portion of the recessed shape to a surface side.

Further, as described above, the first fiducial mark 22 is formed at any position of the region on the outer peripheral edge side from the pattern formation region on the main surface of the substrate 20' with a multilayer reflective film (see FIG. 7, FIG. 8, and FIG. 9). In this case, the first fiducial mark may be formed with reference to an edge, or a fiducial mark formation position may be identified by coordinate measurement equipment after the first fiducial mark is formed.

For example, when the first fiducial mark 22 is processed with a focused ion beam (FIB), the edge of the substrate 20' with a multilayer reflective film can be recognized in a secondary electron image, a secondary ion image, or an optical image. Further, when the first fiducial mark 22 is processed by another method (for example, indentation), the edge of the substrate 20' with a multilayer reflective film can be recognized in an optical image. For example, edge coordinates in eight portions of four sides of the substrate 20' with a multilayer reflective film are confirmed and subjected to tilt correction to determine an origin (0, 0). The origin in this case can be suitably set and may be a corner portion or a center of the substrate. The first fiducial mark 22 is formed with an FIB at a predetermined position from the origin set with reference to an edge.

When the first fiducial mark 22 formed with reference to an edge is detected by the defect inspection device, formation position information on the fiducial mark, that is, the distance from the edge is known. Therefore, it is possible to easily identify the fiducial mark formation position.

Further, a method of identifying the fiducial mark formation position with the coordinate measurement equipment can also be applied after the first fiducial mark 22 is formed at any position on the multilayer reflective film 21. The coordinate measurement equipment is configured to measure the formation coordinates of the first fiducial mark with reference to an edge. For example, a high-accuracy pattern position measurement device (LMS-IPR04 manufactured by KLA-Tencor Corporation) can be used, and identified fiducial mark formation coordinates serve as formation position information on the fiducial mark.

Next, the substrate 20' with a multilayer reflective film having the first fiducial marks 22 formed thereon, which is manufactured as described above, is subjected to defect inspection. That is, the first fiducial marks 22 as well as the substrate 20' with a multilayer reflective film are subjected to defect inspection by the defect inspection device to acquire a defect detected by the defect inspection and position information thereon, to thereby acquire defect information including the first fiducial marks 22. Further, the defect inspection in this case is performed on at least the entire surface of the pattern formation region. As a defect inspection device for the substrate 20' with a multilayer reflective film, for example, the mask substrate/blank defect inspection system for EUV exposure [MAGICS M7360] having an inspection light source wavelength of 266 nm manufactured by Lasertec Corporation, the EUV mask/blank defect inspection system "Teron 600 series, for example, Teron 610" having an inspection light source wavelength of 193 nm manufactured by KLA-Tencor Corporation, the ABI device having an exposure light source wavelength of 13.5 nm as an inspection light source wavelength, and the like, which have been described above, can be preferably used. In particular, it is suitable that the defect inspection with high accuracy be performed through use of the defect inspection device, for example, the ABI device capable of detecting a minute defect.

Next, the absorber film 31, which is configured to absorb EUV light, is formed on the multilayer reflective film 21 in the substrate 20' with a multilayer reflective film (on the protective film when the multilayer reflective film has the protective film on the surface thereof) to manufacture a reflective mask blank (see FIG. 10(b)).

Although not shown, a rear surface conductive film may be formed on a surface of the glass substrate 10 opposite to the surface on which the multilayer reflective film and the like are formed.

In the second embodiment, when the absorber film 31 is formed on the above-mentioned multilayer reflective film 21, the absorber film 31 is not formed in a predetermined portion of the main surface of the substrate 20' with a multilayer reflective film, specifically, in an area including the first fiducial mark 22 formed on the substrate 20' with a multilayer reflective film, and the alignment region 32', in which the multilayer reflective film 21 of the area including the first fiducial mark 22 is exposed, is formed in the area (see FIG. 10(b)). The alignment region 32' is formed into a shape and a size so that the multilayer reflective film 21 of the area including the first fiducial mark 22 formed on the multilayer reflective film 21 is exposed.

Figure 11:
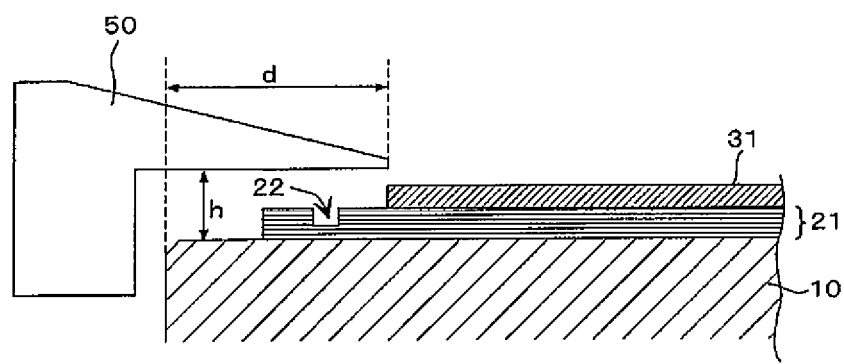
FIG. 11 is a schematic sectional view for illustrating a method of forming an alignment region in an outer peripheral edge region of a pattern formation region in each of the second and third embodiments.

In a step of forming the alignment region 32', the absorber film 31 is formed under a state in which a shielding member is provided so that the absorber film 31 is not formed and the multilayer reflective film 21 is exposed in the alignment region 32'. For example, as illustrated in FIG. 11, a shielding member 50 is set at a distance from a substrate peripheral edge in a predetermined portion of the main surface of the substrate 20' with a multilayer reflective film, in which the alignment region 32' is formed, and the absorber film 31 is formed, for example, by sputtering. In the vicinity of the substrate peripheral edge, the shielding member 50 is provided so as to cover the multilayer reflective film 21 of the area including the first fiducial mark 22. Therefore, it is only required that a shape, a size, and a shielding length d of the shielding member 50 be determined in consideration of the shape, size, and the like of the alignment region 32' to be formed. Further, a separate distance h between the main surface of the glass substrate 10 and the shielding member 50 may be appropriately regulated, and it is suitable that the separate distance h be generally set to about 9 mm.

In the above-mentioned alignment region forming step of the film formation method, in the area including the first fiducial mark 22 formed on the substrate 20' with a multilayer reflective film, the absorber film 31 is not formed, and the alignment region 32', in which the multilayer reflective film 21 of the area including the first fiducial mark 22 is exposed, is formed. The absorber film 31 is formed on the substrate 20' with a multilayer reflective film excluding the alignment region 32'.

As a method of forming the alignment region 32', for example, a method involving forming the absorber film on the entire surface of the substrate with a multilayer reflective film and removing (peeling) the absorber film in the region serving as the alignment region, to thereby form the alignment region in which the multilayer reflective film of the area including the fiducial mark is exposed is also conceivable. However, in this method, there is a risk, for example, in that the fiducial mark may be deformed by removing the absorber film in the alignment region. Further, there is also a risk of dust generation at a time when the absorber film is removed. In contrast, in the alignment region forming step in the second embodiment as described above, in the area including the first fiducial mark 22 formed on the substrate 20' with a multilayer reflective film, the absorber film 31 is not formed, and the alignment region 32', in which the multilayer reflective film 21 of the area including the first fiducial mark 22 is exposed, is formed. Therefore, the risk of deformation of the fiducial mark and the like is prevented, and there is no problem in dust generation described above.

The absorber film 31 is the same as that in the first embodiment, and hence overlapping description thereof is omitted.

Next, the second fiducial marks 42 are formed in the absorber film 31 (see FIG. 10(c)).

Each of the second fiducial marks 42 serves as a reference for managing relative coordinates with respect to the first fiducial mark 22, and is formed in the vicinity of the pattern formation region side of the alignment region 32' in the absorber film 31. In the embodiment of FIG. 7, the second fiducial mark 42 is formed, as one specific example, in the vicinity of the first fiducial mark 22 in the substrate corner and in the vicinity of an outer side of the corner of the pattern formation region. The second fiducial mark 42 has already been described in detail, and hence overlapping description thereof is omitted.

As a method of removing the absorber film 31 corresponding to an area for forming the second fiducial mark 42, for example, it is suitable that a focused ion beam be applied. Further, photolithography can also be applied. In this case, a predetermined resist pattern (pattern in which a resist is not formed in the area corresponding to the second fiducial mark) is formed on the absorber film 31, and the absorber film, in which the area corresponding to the second fiducial mark is exposed, is subjected to dry etching through use of the resist pattern as a mask to remove the absorber film 31 corresponding to the area, to thereby form the second fiducial mark 42. As etching gas in this case, the same etching gas as that used for patterning of the absorber film 31 may be used.

In the manner described above, the reflective mask blank 30' is manufactured in which, in the outer peripheral edge region of the pattern formation region, the absorber film 31 is not formed, and the alignment region 32', in which the multilayer reflective film 21 of the area including the first fiducial mark 22 is exposed, and the second fiducial mark 42 are formed (see FIG. 10(c)).

Next, the alignment region 32', which includes the first fiducial mark 22, and the second fiducial mark 42, which have been manufactured as described above, are inspected through use of the defect inspection device. In this case, it is suitable that inspection be performed through use of the same inspection light as that of the inspection device used for performing the defect inspection of the above-mentioned multilayer reflective film. The reason for this is that both the coordinate accuracies by the inspection device can be matched.

In this case, the first fiducial mark 22 formed in the above-mentioned alignment region 32' is inspected with reference to the second fiducial mark 42, and the position coordinates of the first fiducial mark 22 with reference to the second fiducial mark 42 are detected. After that, defect information (first defect map) with reference to the first fiducial mark 22 is created based on the defect information on the substrate 20' with a multilayer reflective film obtained by the above-mentioned defect inspection, and the defect information (first defect map) is converted into defect information (second defect map) with reference to the second fiducial mark through use of the coordinates of the first fiducial mark 22 with reference to the second fiducial mark 42. It is suitable that the first fiducial mark 22 and the second fiducial mark 42 be inspected through use of the defect inspection device capable of detecting a minute defect high accuracy, for example, the above-mentioned ABI device.

The alignment region 32', which includes the first fiducial mark 22, and the second fiducial mark 42 may be inspected through use of the above-mentioned coordinate measurement equipment instead of the defect inspection device, and the position coordinates of the first fiducial mark 22 with reference to the second fiducial mark 42 may be detected.

In the reflective mask blank 30' obtained in the second embodiment, the alignment region 32', in which the multilayer reflective film 21 of the area including the first fiducial mark 22 is exposed, is formed in the outer peripheral edge region of the pattern formation region. Therefore, the reflective mask blank 30' can be subjected to defect management through use of the alignment region 32'. That is, the relative coordinates between the first fiducial mark 22 and the second fiducial mark 42 can be managed through use of the alignment region 32'. As a result, the defect information (second defect map) with reference to the second fiducial mark 42 can be obtained from the defect information (first defect map) with reference to the first fiducial mark 22. The absorber film 31 is formed on the multilayer reflective film 21, and hence a defect of the multilayer reflective film 21 is also reflected onto the absorber film 31. Therefore, the defect of the multilayer reflective film 21 can be managed with high accuracy with reference to the second fiducial mark 42 through the alignment region 32'. When the defect management of the reflective mask blank 30 is performed, even a minute defect can be detected with high accuracy, in particular, through use of the above-mentioned ABI device, and further, defect information with satisfactory accuracy can be acquired. Further, in the second embodiment, the deformation of first fiducial mark 22 caused by formation of the alignment region 32' and the like do not occur, and hence an alignment error using the first fiducial mark 22 is not caused.

Further, the defect inspection of the surface of the reflective mask blank 30' may not be performed, but in order to perform the defect management with higher accuracy, entire surface inspection and partial inspection in which an inspection time is shortened can also be performed.

In the above-mentioned second and third embodiments, description is given of the reflective mask blank in which the first fiducial mark 22 serving as a reference of the defect information is formed in the alignment region 32'. However, as described above, when an actual defect that can be subjected to alignment with inspection light of the defect inspection device is present in the alignment region 32', such actual defect may be used as the first fiducial mark 22. The coordinates of the actual defect with reference to the second fiducial mark 42 can be detected when the alignment region 32' is inspected.

As described above, in the reflective mask blank 30' obtained by the manufacturing method according to the second and third embodiments of this invention, the alignment region 32', in which the multilayer reflective film 21 of the area including the first fiducial mark 22 is exposed, is formed in the outer peripheral edge region of the pattern formation region. Therefore, the defect management with high accuracy of the reflective mask blank 30' can be performed through use of the alignment region 32', specifically, through use of the first fiducial mark 22 formed in the alignment region 32'. As a result, defect information with satisfactory accuracy containing the defect position information can be acquired. Further, the relative coordinates between the first fiducial mark 22 and the second fiducial mark 42 can be managed through use of the alignment region 32' and the second fiducial mark 42.

In the same manner as in the first embodiment, the reflective mask blank 30' according to each of the second and third embodiments of this invention also encompasses a mode in which a hard mask film (sometimes referred to as "etching mask film") is formed on the absorber film 31. The hard mask film has a mask function at a time when the absorber film 31 is patterned, and is formed of a material having etching selectivity different from that of a material for the uppermost layer of the absorber film 31. The material for the hard mask film is as described in the first embodiment.

Further, the reflective mask blank 30' according to each of the second and third embodiments of this invention can have the following configuration. The absorber film is formed of a laminated film including an uppermost layer and other layers, which are made of materials having a difference in etching selectivity, and the uppermost layer serves as a hard mask film for the other layers.

As described above, the absorber film 31 in the reflective mask blank 30' according to each of the second and third embodiments of this invention is not limited to a single-layer film, and can be formed a laminated film made of the same material or a laminated film made of different kinds of materials. Further, the absorber film 31 can be formed of a laminated film including an absorber film of the above-mentioned laminated film or single-layer film, and a hard mask film.

Further, the reflective mask blank 30' according to each of the second and third embodiments of this invention also encompasses a mode in which a resist film is formed on the absorber film 31. Such resist film is used for patterning of the absorber film in the reflective mask blank by photolithography.

Further, when the resist film is formed on the absorber film 31 through intermediation of the hard mask film or formed directly on the absorber film 31, the shape of the second fiducial mark 42 is transferred onto the resist film. The second fiducial mark 42 transferred onto the resist film has contrast with respect to electron beam scanning by the electron beam drawing device, and can be detected with an electron beam. In this case, the relative coordinates between the first fiducial mark 22 and the second fiducial mark 42 are managed, and hence drawing with high accuracy can be performed even when the shape of the first fiducial mark 22, which is relatively smaller than that of the second fiducial mark 42, is not transferred onto the resist film.

In order to further improve the contrast with respect to the electron beam scanning, the resist film may not be formed in the area including the second fiducial mark 42, or the resist film on the area including the second fiducial mark 42 may be removed.

[Reflective Mask According to Each of Second and Third Embodiments]

This invention also provides a reflective mask in which the absorber film in the reflective mask blank having the above-mentioned configuration of FIG. 7 is patterned, and a manufacturing method therefor. This description may also be applied to the third embodiment.

Specifically, a resist for electron beam drawing is applied onto the above-mentioned reflective mask blank 30' and baked to form a resist film. The resist film is then subjected to drawing and development through use of the electron beam drawing device to form a resist pattern corresponding to the transfer pattern on the resist film. After that, the absorber film 31 is patterned through use of the resist pattern as a mask to form the absorber film pattern 31a, to thereby manufacture the reflective mask 40' (see FIG. 10(d)).

In the second embodiment, for example, the drawing pattern can be modified based on the defect information with reference to the second fiducial mark 42 in the above-mentioned reflective mask blank 30' to pattern the absorber film 31.

As a method of patterning the absorber film 31 serving as a transfer pattern in the reflective mask blank 30', the above-mentioned photolithography is most suitable. When a reflective mask is manufactured through use of the reflective mask blank having a configuration including the above-mentioned hard mask film, the hard mask film may be finally removed. However, when the hard mask film, if any remains, does not affect the function of the reflective mask, the hard mask film may not be particularly removed.

The reflective mask 40' obtained as described above includes at least the multilayer reflective film 21, which is configured to reflect EUV light and is formed on the substrate 10, and the absorber film pattern 31a, which is configured to absorb the EUV light and is formed on the multilayer reflective film 21. In the outer peripheral edge region of the pattern formation region on the main surface of the reflective mask 40', the absorber film 31 is not formed, and the alignment region 32', in which the multilayer reflective film 21 of the area including the first fiducial mark 22 is exposed, is formed. Further, the second fiducial mark 42 is formed in the vicinity of the pattern formation region side of the alignment region 32'.

In the second and third embodiments, as described above, the defect management of the reflective mask blank can be performed with high accuracy by acquiring the defect information with satisfactory accuracy containing the defect position information on the multilayer reflective film. Therefore, in manufacturing of a mask, matching with drawing data (mask pattern data) that is designed in advance is performed based on the defect information, and the drawing data can be modified (corrected) with high accuracy so that the effect of a defect is reduced. As a result, a finally manufactured reflective mask 40' in which defects are reduced can be obtained.

Further, a semiconductor device of high quality having less defects can be manufactured by transferring a transfer pattern by exposure onto a resist film on a semiconductor substrate through use of the above-mentioned reflective mask 40'.

EXAMPLES

Now, the second and third embodiments of this invention are more specifically described by way of Examples.

Example 2

A $SiO_2$—$TiO_2$-based glass substrate (having a size of about 152.0 mm× about 152.0 mm and a thickness of about 6.35 mm) was prepared by gradually polishing a substrate surface with cerium oxide abrasive grains or colloidal silica abrasive grains through use of a double side polisher and treating the substrate surface with fluorosilicic acid having low concentration. The obtained glass substrate had a root-mean-square roughness (Rq) of 0.25 nm as surface roughness. The surface roughness was measured by an atomic force microscope (AFM), and the measurement region was set to 1 μm×1 μm.

Next, a Si film (film thickness: 4.2 nm) and a Mo film (film thickness: 2.8 nm) were laminated on a main surface of the glass substrate by 40 periods through use of an ion beam sputtering device, with the Si film and the Mo film being one period, and a Si film (film thickness: 4 nm) was finally formed on the laminate. Further, a protective film (film thickness: 2.5 nm) made of Ru was formed on the resultant to obtain a substrate with a multilayer reflective film.

Next, first fiducial marks each having a surface shape described below and a recessed sectional shape were formed in predetermined portions (positions illustrated in FIG. 8 described above) of the surface of the multilayer reflective film of the substrate with a multilayer reflective film. The first fiducial marks were formed by indentation (punching) through use of a micro-indenter. Specifically, the first fiducial marks were formed by pressing the micro-indenter against the multilayer reflective film under a predetermined pressure. After the first fiducial marks were formed, the resultant was washed.

In Example 2, each of the first fiducial marks had the above-mentioned circular shape illustrated in FIG. 3(a) having a size of 500 nm in diameter and a depth of 60 nm.

Next, the first fiducial marks as well as the surface of the substrate with a multilayer reflective film were subjected to defect inspection through use of the above-mentioned ABI device. In this defect inspection, defect position information on a protrusion and a recess and defect size information were acquired, and thus defect information on the first fiducial marks as well as the substrate with a multilayer reflective film was acquired.

Further, the reflectance of the surface of the protective film of the substrate with a multilayer reflective film was evaluated by an EUV reflectometer to be satisfactorily 64%±0.2%.

Next, an absorber film formed of a laminated film of a TaBN film (film thickness: 56 nm) and a TaBO film (film thickness: 14 nm) was formed on the protective film of the substrate with a multilayer reflective film through use of a DC magnetron sputtering device, and a CrN conductive film (film thickness: 20 nm) was formed on a rear surface of the substrate with a multilayer reflective film to obtain a reflective mask blank.

When the above-mentioned absorber film 31 was formed, in order to prevent the absorber film 31 from being formed in a predetermined portion of the main surface of the above-mentioned substrate 20' with a multilayer reflective film, specifically, in an area including the first fiducial mark 22 formed on the substrate 20' with a multilayer reflective film, the absorber film 31 was formed under a state in which a shielding member was set at a distance from the substrate peripheral edge as illustrated in FIG. 11. In order to cover the multilayer reflective film in the area including the first fiducial mark with the shielding member, the shape, size, and shielding length d of the shielding member were determined in consideration of the shape, size, and the like of the alignment region to be formed. In Example 2, the shape and size were set to be the same as those illustrated in FIG. 11. Further, the separate distance h between the glass substrate main surface and the shielding member was also appropriately regulated.

Through use of the above-mentioned method, in the area including the first fiducial mark, the absorber film was not formed, and the alignment region, in which the multilayer reflective film of the area including the first fiducial mark was exposed, was formed. The absorber film was formed on the substrate with a multilayer reflective film excluding the alignment region. The deformation of the first fiducial mark formed in the alignment region and the like did not occur.

Next, the second fiducial marks were formed in predetermined portions (positions illustrated in FIG. 7 described above) of the surface of the reflective mask blank. The second fiducial marks were each formed into the above-mentioned cross-like shape illustrated in FIG. 4(a). The second fiducial mark had the cross-like shape having a size of 5 μm in width and 550 μm in length and a depth of about 70 nm because the absorber film was completely removed.

In order to form the above-mentioned second fiducial marks, a focused ion beam was used. The condition in this case was set to an acceleration voltage of 50 kV and a beam current value of 20 pA. After the second fiducial marks were formed, the resultant was washed. Thus, the reflective mask blank having the second fiducial marks formed thereon was obtained.

The first fiducial marks in the alignment regions and the second fiducial marks in the obtained reflective mask blank were inspected by the above-mentioned ABI device, which is the same as that used for defect inspection of the substrate with a multilayer reflective film. In this case, the first fiducial marks were inspected with reference to the second fiducial marks, and position coordinates of the first fiducial marks with reference to the second fiducial marks were detected. In the alignment region, the multilayer reflective film was exposed, and hence the first fiducial mark in the alignment region was able to be detected with satisfactory accuracy by the ABI device. A defect of the multilayer reflective film can be managed with high accuracy with reference to the second fiducial mark by managing the relative coordinates between the second fiducial mark and the first fiducial mark.

As described above, defect information on the reflective mask blank with reference to the second fiducial marks was acquired.

Further, the defect information was corrected to be converted into reference coordinates in the electron beam drawing step by measuring the second fiducial marks with a coordinate measurement device (LMS-IPR04 manufactured by KLA-Tencor Corporation).

Next, an EUV reflective mask was manufactured through use of the EUV reflective mask blank from which the defect information was acquired.

First, a resist for electron beam drawing was applied onto the EUV reflective mask blank by a spin coating method and baked to form a resist film.

In this case, alignment was performed based on the second fiducial marks. Then, matching with mask pattern data that was designed in advance was performed based on the defect information on the EUV reflective mask blank, and the mask pattern was drawn and developed on the above-mentioned resist film through use of an electron beam to form a resist pattern by modifying the drawing data to mask pattern data having no effect on the pattern transfer using an exposure device or by modifying, when it was determined that there was an effect on the pattern transfer, the drawing data to, for example, mask pattern data in which modified pattern data was added so as to cover a defect under the pattern. In Example 2, the defect information containing the defect position information with high accuracy had been acquired, and hence the mask pattern data was able to be modified with high accuracy.

Through use of the resist pattern as a mask, the TaBO film of the absorber film was removed by etching with fluorine-based gas ($CF_4$ gas) and the TaBN film thereof was removed by etching with chlorine-based gas ($Cl_2$ gas), to thereby form an absorber film pattern on the protective film.

Further, the resist pattern remaining on the absorber film pattern was removed with hot sulfuric acid to obtain an EUV reflective mask.

The reflective mask thus obtained was set on the exposure device, and pattern transfer onto a semiconductor substrate having a resist film formed thereon was performed, with the result that the satisfactory pattern transfer was able to be performed without a defect of the transfer pattern caused by the reflective mask.

Reference Example 2

A reflective mask blank was manufactured in the same manner as in Example 2 except that the absorber film was formed on the entire surface and the above-mentioned alignment regions were not formed when the absorber film was formed on the substrate with a multilayer reflective film having the first fiducial marks formed thereon in Example 2 described above.

In the same manner as in Example 2, the substrate with a multilayer reflective film was subjected to defect inspection by the ABI device to acquire defect position information and defect size information. Further, in the reflective mask blank, the areas of the absorber film in which the first fiducial marks were formed were inspected by the ABI device, with the result that the first fiducial marks formed on the multilayer reflective film had low contrast in EUV light and were not able to be detected with satisfactory accuracy. Therefore, the accuracy of the acquired defect coordinates was unsatisfactory, and it was difficult to acquire defect information on the reflective mask blank.

Next, an EUV reflective mask was manufactured through use of the EUV reflective mask blank in the same manner as in Example 2.

The obtained EUV reflective mask was set on the exposure device, and pattern transfer onto a semiconductor substrate having a resist film formed thereon was performed, with the result that a transfer pattern defect caused by the reflective mask was observed. The cause for the foregoing was considered as follows. As described above, the accuracy of the defect coordinates of the first fiducial marks was unsatisfactory, and hence it was difficult to acquire defect information on the reflective mask blank. Therefore, in the pattern drawing step, the mask pattern data was not able to be modified with high accuracy based on the defect information on the EUV reflective mask blank, and a defect on the multilayer reflective film was not able to be covered under the absorber film pattern with satisfactory accuracy.

Also in Example 2, as in Example 1, description has been given of the example in which the first fiducial marks were formed by indentation through use of a micro-indenter, but this invention is not limited thereto. As described above, besides this method, the first fiducial marks can be formed, for example, by forming a recessed portion through use of a focused ion beam, photolithography, laser light, or the like, by forming a machining mark through scanning of a diamond needle, or by embossing through use of an imprint method. Further, also in Example 2, description has been given of the example in which the first fiducial marks are formed in the alignment regions, but actual defects present in the alignment regions may be used.

REFERENCE SIGNS LIST

10 glass substrate
20, 20' substrate with multilayer reflective film
21 multilayer reflective film
22 first fiducial mark
30, 30' reflective mask blank
31 absorber film
32, 32', 33 alignment region
40, 40' reflective mask
42 second fiducial mark
42*a* main mark
42*b*, 42*c*, 42*d*, 42*e* auxiliary mark
50 shielding member

The invention claimed is:

1. A reflective mask blank comprising:
   a substrate;
   a multilayer reflective film configured to reflect EUV light and formed on the substrate; and
   an absorber film configured to absorb EUV light and formed on the multilayer reflective film,
   wherein the reflective mask blank has a pattern formation region, an outer peripheral edge region, and an alignment region formed in the outer peripheral edge region, and
   wherein the alignment region is formed by an opening in the absorber film that exposes an area of the multilayer reflective film, and
   wherein the exposed area of the multilayer reflective film includes an element serving as a reference of defect information, wherein the element is a first fiducial mark formed in the alignment region.

2. A reflective mask blank according to claim 1, wherein the reflective mask blank has a second fiducial mark, which serves as a reference of the first fiducial mark, formed in a vicinity of the alignment region in the absorber film and between the alignment region and an outer peripheral edge of the reflective mask blank.

3. A reflective mask blank according to claim 2, wherein the first fiducial mark and the second fiducial mark fall within a region of 10 mm×10 mm.

4. A reflective mask blank according to claim 2, wherein the second fiducial mark is relatively larger than the first fiducial mark.

5. A reflective mask blank according to claim 2, wherein a width or a length of the second fiducial mark is larger than that of the first fiducial mark.

6. A reflective mask blank according to claim 2, wherein a depth or a height of a sectional shape of the second fiducial mark is larger than that of the first fiducial mark.

7. A method of manufacturing a reflective mask, the method comprising patterning the absorber film in the reflective mask blank of claim 1, to form an absorber film pattern.

8. A reflective mask comprising:
   a substrate;
   a multilayer reflective film configured to reflect EUV light and formed on the substrate; and
   an absorber film pattern configured to absorb EUV light and formed on the multilayer reflective film,
   wherein the reflective mask has a pattern formation region, an outer peripheral edge region, and an alignment region formed in the outer peripheral edge region, and
   wherein the alignment region includes an exposed area of the multilayer reflective film that includes an element serving as a reference of defect information, wherein the element is a first fiducial mark formed in the alignment region.

9. A reflective mask according to claim 8, wherein the reflective mask has a second fiducial mark, which serves as a reference of the first fiducial mark, formed in a vicinity of the alignment region in the absorber film pattern and between the alignment region and an outer peripheral edge of the reflective mask.

10. A method of manufacturing a semiconductor device, comprising transferring a transfer pattern by exposure to a resist film on a semiconductor substrate through use of the reflective mask of claim 8, to manufacture a semiconductor device.

11. A method of manufacturing a reflective mask blank including at least a multilayer reflective film, which is configured to reflect EUV light and is formed on a substrate, and an absorber film, which is configured to absorb the EUV light and is formed on the multilayer reflective film,
   the method comprising:
   forming the multilayer reflective film on the substrate to form a substrate with a multilayer reflective film;

subjecting the substrate with a multilayer reflective film to defect inspection; and forming the absorber film on the multilayer reflective film of the substrate with a multilayer reflective film to form a reflective mask blank having a pattern formation region and an outer peripheral edge region, the forming the absorber film including a step of forming, in the outer peripheral edge region, an alignment region without forming the absorber film, so that an area of the multilayer reflective film that includes a first fiducial mark, which serves as a reference of defect information on the multilayer reflective film, is exposed in the alignment region, the method further comprising:
forming a second fiducial mark, which serves as a reference of the first fiducial mark, in the absorber film and between the pattern formation region and the alignment region; and performing defect management of the reflective mask blank through use of the alignment region.

12. A method of manufacturing a reflective mask blank according to claim 11, wherein the step of forming the alignment region includes forming the absorber film with a shielding member being provided so that the absorber film is prevented from being formed and the multilayer reflective film is exposed.

13. A method of manufacturing a reflective mask blank according to claim 11, wherein the defect management of the reflective mask blank is performed through use of the first fiducial mark formed in the alignment region.

14. A method of manufacturing a reflective mask blank according to claim 11, wherein the defect management of the reflective mask blank includes detecting coordinates of the first fiducial mark with reference to the second fiducial mark, and converting the defect information on the substrate with a multilayer reflective film with reference to the second fiducial mark.

15. A method of manufacturing a reflective mask blank according to claim 14, wherein the detecting of the coordinates of the first fiducial mark with reference to the second fiducial mark is performed through use of inspection light having a wavelength of less than 100 nm.

16. A method of manufacturing a reflective mask blank according to claim 11, wherein the defect inspection of the substrate with a multilayer reflective film is performed through use of inspection light having a wavelength of less than 100 nm.

17. A reflective mask blank comprising:
a substrate;
a multilayer reflective film configured to reflect EUV light and formed on the substrate; and
an absorber film configured to absorb EUV light and formed on the multilayer reflective film, wherein the reflective mask blank has a pattern formation region, an outer peripheral edge region, and an alignment region formed in the outer peripheral edge region, and wherein the alignment region is formed by an opening in the absorber film that exposes an area of the multilayer reflective film, and wherein the exposed area of the multilayer reflective film includes a first fiducial mark, which serves as a reference of defect information on the multilayer reflective film, and wherein the reflective mask blank has a second fiducial mark, which serves as a reference of the first fiducial mark, formed in the absorber film and between the pattern formation region and the alignment region.

18. A reflective mask blank according to claim 17, wherein the first fiducial mark and the second fiducial mark fall within a region of 10 mm×10 mm.

19. A reflective mask blank according to claim 17, wherein the second fiducial mark is relatively larger than the first fiducial mark.

20. A reflective mask blank according to claim 17, wherein a width or a length of the second fiducial mark is larger than that of the first fiducial mark.

21. A reflective mask blank according to claim 17, wherein a depth or a height of a sectional shape of the second fiducial mark is larger than that of the first fiducial mark.

22. A method of manufacturing a reflective mask, comprising patterning the absorber film in the reflective mask blank of claim 17, to form an absorber film pattern.

23. A reflective mask comprising:
a substrate;
a multilayer reflective film configured to reflect EUV light and formed on the substrate; and
an absorber film pattern configured to absorb EUV light and formed on the multilayer reflective film, wherein the reflective mask has a pattern formation region, an outer peripheral edge region, and an alignment region formed in the outer peripheral edge region, and wherein an area of the multilayer reflective film that includes a first fiducial mark, which serves as a reference of defect information on the multilayer reflective film, is exposed in the alignment region, and wherein the reflective mask has a second fiducial mark, which serves as a reference of the first fiducial mark, formed in the absorber film pattern and between the pattern formation region and the alignment region.

24. A method of manufacturing a semiconductor device, comprising transferring a transfer pattern by exposure to a resist film on a semiconductor substrate through use of the reflective mask of claim 23, to manufacture a semiconductor device.

* * * * *